United States Patent
Choi et al.

(10) Patent No.: US 7,751,260 B2
(45) Date of Patent: *Jul. 6, 2010

(54) MEMORY DEVICE HAVING STROBE TERMINALS WITH MULTIPLE FUNCTIONS

(75) Inventors: Joo S. Choi, Boise, ID (US); Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/397,181

(22) Filed: Mar. 3, 2009

(65) Prior Publication Data

US 2009/0231936 A1   Sep. 17, 2009

Related U.S. Application Data

(63) Continuation of application No. 10/765,310, filed on Jan. 27, 2007, now Pat. No. 7,508,722.

(51) Int. Cl.
G11C 7/00   (2006.01)
(52) U.S. Cl. .................. 365/193; 365/211; 365/200
(58) Field of Classification Search ........... 365/193, 365/211, 200
See application file for complete search history.

(56) References Cited

U.S. PATENT DOCUMENTS

| 4,792,896 | A | 12/1988 | Maclean et al. |
| 4,939,692 | A | 7/1990 | Kendall |
| 4,965,828 | A * | 10/1990 | Ergott et al. ............ 713/193 |
| 5,127,014 | A | 6/1992 | Raynham |
| 5,307,314 | A | 4/1994 | Lee |
| 5,673,233 | A | 9/1997 | Wright et al. |
| 5,822,334 | A | 10/1998 | Whittaker et al. |
| 5,963,504 | A | 10/1999 | Manning |
| 6,286,077 | B1 | 9/2001 | Choi et al. |
| 6,560,669 | B1 | 5/2003 | Ryan |
| 6,788,594 | B2 * | 9/2004 | Ware et al. ............ 365/194 |
| 6,798,367 | B2 * | 9/2004 | Nakagawa et al. ........ 341/144 |
| 6,961,269 | B2 * | 11/2005 | Royer ............ 365/189.18 |
| 6,978,367 | B1 | 12/2005 | Hind et al. |
| 2003/0174559 | A1 * | 9/2003 | Cooper et al. ............ 365/200 |
| 2005/0165999 | A1 | 7/2005 | Choi et al. |

FOREIGN PATENT DOCUMENTS

WO   WO-2005073974 A1   8/2005

* cited by examiner

*Primary Examiner*—Hoai V Ho
*Assistant Examiner*—Jason Lappas
(74) *Attorney, Agent, or Firm*—Schwegman, Lundberg & Woessner, P.A.

(57) ABSTRACT

A memory device has data transceivers, write strobe transceivers, and read strobe transceivers. The data transceivers transfer input data to the memory device and transfer output data from the memory device. The write strobe transceivers transfer timing information of the input data. The read strobe transceivers transfer timing information of the output data. The memory device also has an auxiliary circuit for generating auxiliary information. The auxiliary information includes information different from the timing information of the input data and the output data. The auxiliary circuit uses the write and read transceivers to transfer the auxiliary information to and from the memory device.

33 Claims, 17 Drawing Sheets

|  | B0 - - - B7 | INVo | X | Y |
|---|---|---|---|---|
| DOp | 00000111 |  |  |  |
| ROW 1 Dout / INVERTED Dout | 11111000 / 00000111 | 1 | 8 | 0 |
|  | 11110000 / 00001111 | 1 | 7 | 1 |
|  | 11100000 / 00011111 | 1 | 6 | 2 |
|  | 11000000 / 00111111 | 1 | 5 | 3 |
|  | 10000000 / 01111111 | 0 | 4 | 4 |
| ROW 6 Dout / INVERTED Dout | 00000000 / 11111111 | 0 | 3 | 5 |
|  | 00000001 / 11111110 | 0 | 2 | 6 |
|  | 00000011 / 11111100 | 0 | 1 | 7 |
|  | 00000111 / 11111000 | 0 | 0 | 8 |
|  | 00001111 / 11110000 | 0 | 1 | 7 |
|  | 00011111 / 11100000 | 0 | 2 | 6 |
|  | 00111111 / 11000000 | 0 | 3 | 5 |
|  | 01111111 / 10000000 | 0 | 4 | 4 |
|  | 11111111 / 00000000 | 1 | 5 | 3 |
|  | 11111110 / 00000001 | 1 | 6 | 2 |
| ROW 16 Dout / INVERTED Dout | 11111100 / 00000011 | 1 | 7 | 1 |

FIG. 5

|  | B0 - - - - B7 | P |
|---|---|---|
| ROW 1 | 00000000 | 0 |
|  | 00000001 | 1 |
| ROW 3 | 00000011 | 0 |
|  | 00000111 | 1 |
|  | 00001111 | 0 |
| ROW 6 | 00011111 | 1 |
|  | 00111111 | 0 |
|  | 01111111 | 1 |
|  | 11111111 | 0 |
|  | 11111110 | 1 |
|  | 11111100 | 0 |
|  | 11111000 | 1 |
|  | 11110000 | 0 |
| ROW 14 | 11100000 | 1 |
|  | 11000000 | 0 |
|  | 10000000 | 1 |

FIG. 8

|  | COL1 | COL2 | COL3 | COL4 | COL5 | COL6 | COL7 | COL8 |
|---|---|---|---|---|---|---|---|---|
| BITS | TMP | TMP | TMP | TMP | TMP | TMP | TMP | TMP |
| TB0 | 0 | 0 | 0 | 0 | 0 | 0 | 0 | 0 |
| TB1 | 0 | 0 | 0 | 0 | 0 | 0 | 0 | 1 |
| TB2 | 0 | 0 | 0 | 0 | 0 | 0 | 1 | 1 |
| TB3 | 0 | 0 | 0 | 0 | 0 | 1 | 1 | 1 |
| TB4 | 0 | 0 | 0 | 0 | 1 | 1 | 1 | 1 |
| TB5 | 0 | 0 | 0 | 1 | 1 | 1 | 1 | 1 |
| TB6 | 0 | 0 | 1 | 1 | 1 | 1 | 1 | 1 |
| TB7 | 0 | 1 | 1 | 1 | 1 | 1 | 1 | 1 |
| TEMP °C | 0 | 15 | 30 | 45 | 60 | 75 | 90 | 105 |

FIG. 11

| BITS | COL1 CAL | COL2 CAL | COL3 CAL | COL4 CAL | COL5 CAL | COL6 CAL | COL7 CAL | COL8 CAL |
|---|---|---|---|---|---|---|---|---|
| CB0 | 0 | 0 | 0 | 0 | 0 | 0 | 0 | 0 |
| CB1 | 0 | 0 | 0 | 0 | 0 | 0 | 0 | 1 |
| CB2 | 0 | 0 | 0 | 0 | 0 | 0 | 1 | 1 |
| CB3 | 0 | 0 | 0 | 0 | 0 | 1 | 1 | 1 |
| CB4 | 0 | 0 | 0 | 0 | 1 | 1 | 1 | 1 |
| CB5 | 0 | 0 | 0 | 1 | 1 | 1 | 1 | 1 |
| CB6 | 0 | 0 | 1 | 1 | 1 | 1 | 1 | 1 |
| CB7 | 0 | 1 | 1 | 1 | 1 | 1 | 1 | 1 |
| DELAY | −200 | −150 | −100 | −50 | 50 | 100 | 150 | 200 |

MEMORY DEVICE HAVING STROBE TERMINALS WITH MULTIPLE FUNCTIONS

This application is a Continuation U.S. application Ser. No. 10/765,310, filed Jan. 27, 2004 now U.S. Pat. No. 7,508,722, which is incorporated herein by reference.

FIELD

Embodiments of the present invention relate generally to semiconductor devices, including data strobe terminals in memory devices.

BACKGROUND

Semiconductors devices such as memory devices reside in many computer and electronic products. Memory devices store data. Input data is stored into a memory device in a write operation. Output data is outputted from the memory device in a read operation.

Most memory devices have data (input/output) pins and data strobe pins. The data pins carry the input and output data to and from the memory device. The data strobe pins carry timing information of the data.

Some memory devices have two separate sets of data strobe pins: write data strobe pins and read data strobes pins. The write data strobe pins carry timing information of the input data. The read data strobe pins carry timing information of the output data.

In most cases, the write data strobe pins are unused during the read operation; and the read data strobe pins are unused during the write operation.

Leaving some pins unused in some operations wastes resources.

BRIEF DESCRIPTION OF THE DRAWINGS

FIG. 5 shows exemplary data with inversion information.

FIG. 8 shows exemplary data with parity information.

FIG. 11 shows exemplary temperature information.

FIG. 14 shows exemplary calibrating timing information.

DETAILED DESCRIPTION

Figure 1:
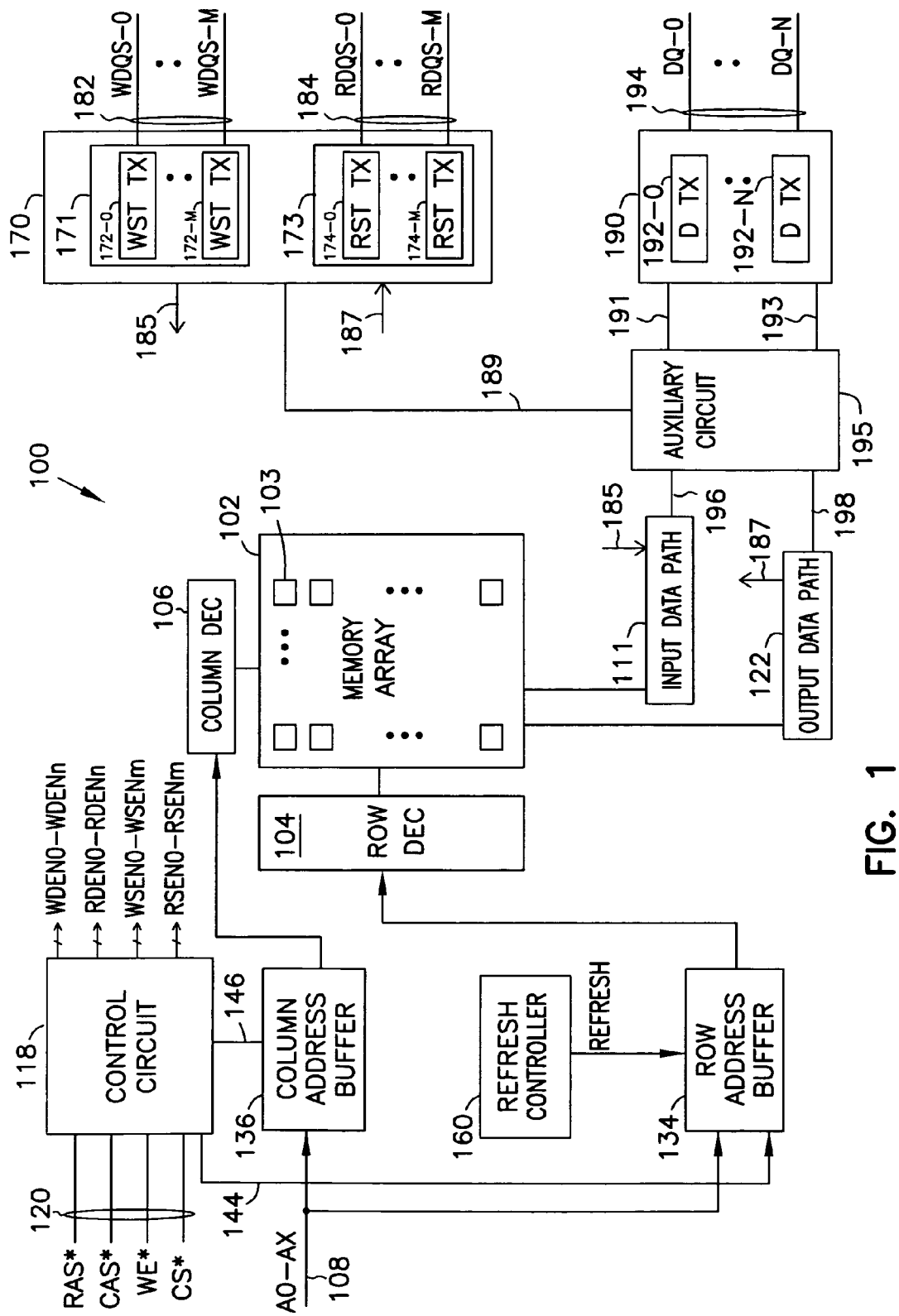
FIG. 1 shows a memory device according to an embodiment of the invention.

The following description and the drawings illustrate specific embodiments of the invention sufficiently to enable those skilled in the art to practice the embodiments of the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows memory device according to an embodiment of the invention. Memory device 100 includes a memory array 102 having a plurality of memory cells 103 arranged in rows and columns.

Row decode 104 and column decode 106 access memory cells 103 in response to address signals A0 through AX (A0-AX), provided on address lines (address bus) 108.

A row address buffer 134 transfers row addresses on lines 108 to row decoder 104 based on signal on line 144. A column address buffer 136 transfers column addresses on lines 108 to column decoder 106 based on signal on line 146.

A control circuit 118 controls the operations of memory device 100 based on control signals on control input lines 120. Examples of the operations of memory device 100 include a read operation, a write operation, and a refresh operation. Examples of the control signals on lines 120 include a Clock signal CLK, a Row Access Strobe signal RAS*, a Column Access Strobe CAS* signal, a Write Enable signal WE*, and a Chip Select signal CS*.

A refresh controller 145 controls the refresh operation of memory device 100 to refresh the content of memory cells 103.

A write operation writes data from data lines 194 to memory cells 103. A read operation reads data from memory cells 103 to data lines 194. The address of a row or a column of memory cells 103 being read or written is provided by a combination of the address signals A0-AX. A refresh operation refreshes the content of memory cells 103.

Control circuit 118 activates certain enable signals during various operations of memory device 100. Example of the enables signals include write data enable signals WDEN0-WDENn, data read enable signals RDEN0-RDENn, write strobe enable signals WSEN0 to WSENm, and read strobe enable signals RSEN0 to RSENm. The functions of these enable signals are described in connection with subsequent figures.

Memory device 100 further includes an input data path 111, an output data path 122, a strobe transceiver circuit 170, and a data transceiver circuit 190. Data transceiver circuit 190 transfers data to and from memory device 100. The data transferred to memory device 100 is input data. The data outputted by memory device 100 is output data. Strobe transceiver circuit 170 transfers timing information of the input data and the output data.

Strobe transceiver circuit 170 includes a write strobe unit 171 having write strobe transceivers (WST TX) 172 (172-0 to 172-M), and read strobe unit 173 having read strobe transceivers (RST TX) 174 (174-0 to 174-M). Write strobe unit 171 transfer timing information of the input data. The write strobe signals WDQS (0-M) on lines 182 represent the timing information of the input data. Read strobe unit 173 transfer timing information of output data. The read strobe signals RDQS (0-M) signals on lines 184 represent the timing information of the output data.

Data transceiver circuit 190 includes data transceivers (D TX) 192 (192-0 to 192-N). Data transceivers 192 are bi-directional circuits; they transfer data in both directions. Data transceivers 192 transfer both of the input data and the output data. The data signals or data DQ (0-N) on lines 194 represent both the input data and the output data. DQ (0-N) represent the input data when memory device 100 receives data during the write operation. DQ (0-N) represent the output data when memory device 100 outputs data during the read operation.

Data path 111 transfers data between data transceiver circuit 190 and memory array 102 during the write operation. Data path 122 transfers data between data transceiver circuit 190 and memory array 102 during the read operation.

Memory device 100 further includes an auxiliary circuit 195 for performing various functions and for transferring auxiliary information to and from memory device 100. In some embodiment, auxiliary circuit 195 uses strobe transceiver circuit 170 for transferring the auxiliary information. The auxiliary information is not timing information of the input data and the output data. Examples of auxiliary information include inverting codes, parity codes, temperature codes, and timing calibrating codes.

The inverting codes carry information associated with the inversion of the input and output data transferred to and from memory device 100. The parity codes carry parity information of the input and output data transferred to and from memory device 100. The temperature codes carry temperature information of memory device 100. The timing calibrating codes carry calibrating information to calibrate a timing of output data outputted from memory device 100.

FIG. 1 includes a number of lines connected between the elements such as lines 185, 187, 189, 191, 193, 196, and 198. Each of the lines 185, 187, 189, 191, 193, 196, and 198 includes multiple lines. For clarity, FIG. 1 shows each of the lines 185, 187, 189, 191, 193, 196, and 198 as a single line.

Lines 182, 184, and 194 correspond to external terminals or connections of memory device 100. In some embodiments, lines 182, 184, and 194 correspond to pins or solder balls on a packaged integrated circuit of memory device 100. In other embodiments, lines 182, 184, and 194 correspond to pads on a circuit die of memory device 100.

Memory device 100 may be a dynamic random access memory (DRAM) device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), and Rambus DRAM devices. Some elements of memory device 100 are omitted for clarity.

Figure 2:
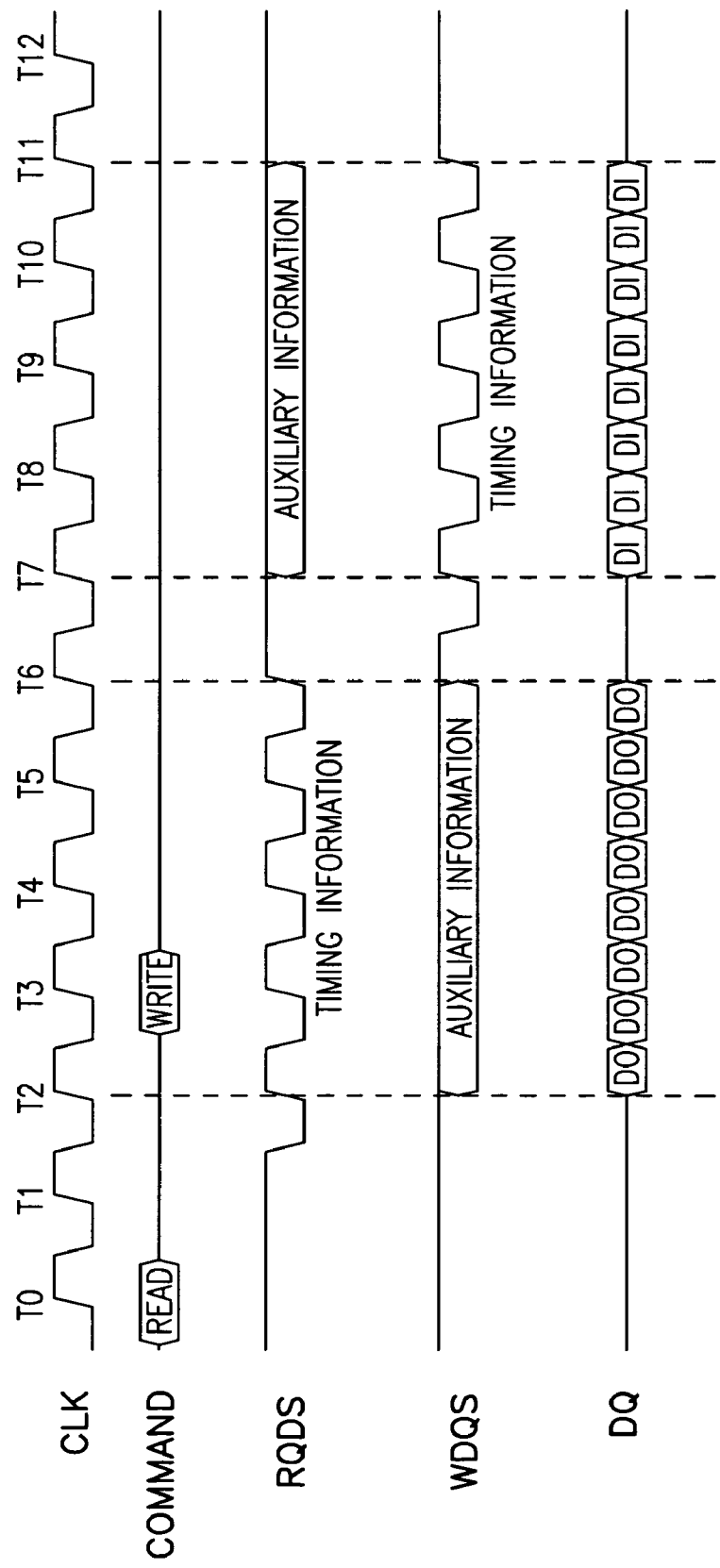
FIG. 2 is an exemplary timing diagram for the memory device of FIG. 1.

FIG. 2 is an exemplary timing diagram for the memory device of FIG. 1. In FIG. 2. T0 through T12 represent various times. CLK represents the CLK signal on lines 110 (FIG. 1). A READ and a WRITE command are issued at various times. For example, at time T0, the READ command is issued in read operation of memory device 100. As another example, at time T3, the WRITE command is issued in a write operation of memory device 100. The READ and WRITE commands are issued based on the combination of signal levels of the control signals on lines 120 (FIG. 1) such as the RAS*, CAS*, WE*, and CS*signals. For example, one combination of signal levels of the RAS*, CAS*, WE*, and CS*signals issues the READ command; another combination of signal levels of the RAS*, CAS*, WE*, and CS*signals issues the WRITE command.

The RDQS signal represents one of the RDQS (0-M) of FIG. 1. The WDQS signal represents one of the WDQS (0-M) of FIG. 1. DQ represents one of the DQ (0-N) of FIG. 1. In FIG. 2, DQ signal represents data DO and data DI. DO is the output data. DI is the input data. DO is outputted from memory device 100 at a particular time after the READ command is issued. For example, DO is outputted between times T2-T6. DI is received by memory device 100 at a particular time after the WRITE command is issued. For example, DI is received between times T7-T11.

After the READ command is issued at time T0, memory device 100 outputs the output data DO between times T2-T6. The RDQS signal, which carries timing information of output data DO, is activated between times T2-T6. FIG. 2 shows that the RDQS signal switches (toggles) when it is activated between times T2-T6. Because only the output data DO is outputted between times T2-T6, only the RDQS signal is activated for carry timing information of the output data between times T2-T6. Because the input data DI is not received until time T7, the WDQS signal is not activated to carry the timing information of DI until time T7. Thus, between times T2-T6 the WDQS signal may be used, or activated, to carry other information.

In the exemplary timing diagram represented by FIG. 2, during the time that output data DO is outputted, the write strobe signal WDQS is activated to carry auxiliary information. As described in FIG. 1, examples of the auxiliary information include inverting codes, parity codes, temperature codes, and timing calibrating codes. The auxiliary information is described in more details in the descriptions of FIG. 3 through FIG. 15.

In a similar method, the read strobe signal RDQS may also be activated to carry auxiliary information during the time that the input data DI is inputted. For example, between times T7-T11, the RDQS signal may be activated to carry auxiliary information during the time that DI is inputted. Between times T7-T11, timing information of the input signal DI is carried by the WDQS signal.

In some embodiments, the WDQS signal is partially activated (partially used) to carry auxiliary information such that the WDQS is activated for an interval less than the entire interval of the transfer of the output data DO. For example, the WDQS signal may be activated for only a portion of the interval between times T2-T6 instead of the entire interval between times T2-T6.

In other embodiments, the WDQS signal is entirely activated (entirely used) to carry auxiliary information for an interval equal to the entire interval of the transfer of the output data DO. For example, the WDQS may be activated for the entire interval between times T2-T6.

In some embodiments, the RDQS signal is partially activated to carry auxiliary information such that the RDQS signal is activated for an interval less than the entire interval of the transfer of the input data DI. For example, the RDQS signal may be activated for only for a portion of the interval between times T7-T11 instead of the entire interval between times T7-T11.

In other embodiments, the RDQS signal is activated to carry auxiliary information for an interval equal to the entire interval of the transfer of the input data DI. For example, the RDQS signal may be activated for the entire interval between times T7-T11.

Figure 3:
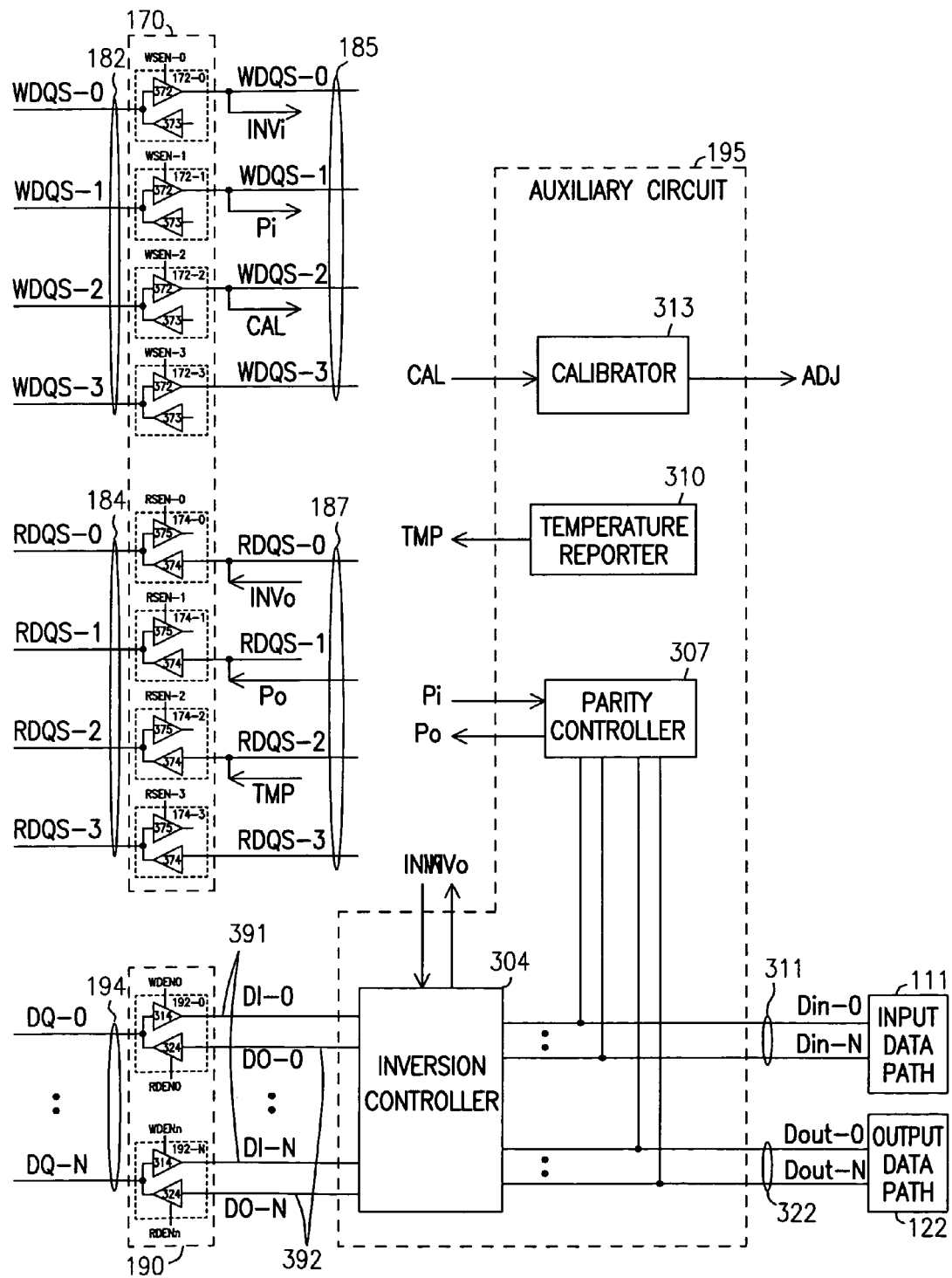
FIG. 3 is a circuit diagram of an auxiliary circuit and transceiver circuits of the memory device of FIG. 1

FIG. 3 is a circuit diagram of an auxiliary circuit and transceiver circuits of FIG. 1. Auxiliary circuit 195 transfers auxiliary information to and from memory device 100 (FIG. 1) via strobe transceiver circuit 170. Auxiliary circuit 195 also operates on the data transferred to and from data transceiver circuit 190.

In some embodiments, during the time that read strobe transceivers 174 are used for transferring timing information of the input data, auxiliary circuit 195 uses write strobe transceivers 172 for transferring auxiliary information. In other embodiments, during the time that write strobe transceivers 172 are used for transferring timing information of the output data, auxiliary circuit 195 uses read strobe transceivers 174 for transferring auxiliary information.

Auxiliary circuit 195 includes an inversion controller 304, a parity controller 307, a temperature reporter 310, and a calibrator 313. Auxiliary circuit 195 connects to data transceiver circuit 190 via lines 391 and lines 392, to input nodes of data input path 111 via lines 311, and to output nodes of data output path 122 via lines 322.

Some of the lines in FIG. 3 are similar to some of the lines in FIG. 1. In FIG. 3, lines 391 and 392 are similar to lines 191 and 192 of FIG. 1, respectively. Lines 311 and 322 are similar to lines 196 and 198 of FIG. 1, respectively.

Auxiliary circuit 195 also connects to strobe transceiver circuit 170 for transferring a number of codes including an input inverting code INVi, an output inverting code INVo, an input parity code Pi, an output parity code Po, a temperature code TMP, and a timing calibrating code CAL. The codes INVi, INVo, Pi, Po, TMP, and CAL represent the auxiliary information. INVo, Po, and TMP form a first group of the auxiliary information. INVi, Pi, and CAL form a second group of the auxiliary information.

Each of the write strobe transceivers 172 has a receiver 372 and a transmitter 373. Receivers 372 are controlled by the write enable signals WSEN0-WSEN3, which are shown in FIG. 1 as WSEN0-WDENm. At appropriate times, the WSEN0-WSEN3 signal are activated to allow receivers 372 to transfer either the timing information (WDQS) of the input data or the auxiliary information (e.g., INVi, PI, and CAL).

Each of the read strobe transceivers 174 has a transmitter 374 and a receiver 375. Transmitters 374 are controlled by the read strobe enable signals RSEN0-RSEN3, which are shown in FIG. 1 as RSEN0-RSENm. At appropriate times, the RSEN0-RSEN3 signals are activated to allow transmitters 374 to transfer either the timing information (RDQS) of the output data or the auxiliary information (INVo, Po, and TMP).

FIG. 3 shows four write strobe transceivers 172 and four read strobe transceivers 174 as an example. In some embodiments, the number of write and read strobe transceivers is different from four.

Each of the data transceivers 192 has a receiver 314 and a transmitter 324 and a receiver 314. Receivers 314 are controlled by the write data enable signals WDEN0-WDEN3, which are shown in FIG. 1 as WDEN0-WDENn. At appropriate times, the WDEN0-WDEN3 signals are activated to allow receivers 314 to receive the input data (DQ). Transmitters 324 are controlled by the read data enable signals RDEN0-RDEN3, which are shown in FIG. 1 as RDEN0-RDENn. At appropriate times, the RDEN0-RDEN3 signals are activated to allow transmitters 324 to output the output data (DQ).

FIG. 3 shows that an equal number of elements exist among a transceiver of the write strobe transceivers 172, a transceiver of the read strobe transceivers 174, and a transceiver of the data transceivers 192. For example, each of the transceivers 172, 174, and 192 has two elements including one receiver and one transmitter. In some embodiment, receivers 372, 375, and 314 are identical (matched) and transmitters 373, 374, and 324 are identical.

In some embodiments, transmitters 373 of write strobe transceivers 172 and receivers 375 of read strobe transceivers 174 are unused. Although unused, the transmitters 373 and receivers 375 improve the balance in loading among the write strobe transceivers, read strobe transceivers, and the data transceivers. A balanced loading among the transceivers improves the performance of the memory device.

Data input signals DI-0 through DI-N on lines 391 represent the input data. For simplicity, DI-0 through DI-N are referred to as DI (0-N) or simply DI. In FIG. 1, DQ (0-N) represent both the input data and the output data. In FIG. 3, DI (0-N) represent the input data DQ (0-N) after DQ (0-N) are transferred from lines 194 to lines 391. Thus, in a write operation when data is inputted to memory device 100 (FIG. 1), DI (0-N) are DQ (0-N).

Data output signals DO-0 through DO-N on lines 392 represent the output data. For simplicity, DO-0 through DO-N are referred to as DO (0-N) or simply DO. FIG. 1, DQ (0-N) represent both the output data and the output data. In FIG. 3, DO (0-N) represent the output data DQ (0-N) after DO (0-N) are transferred from lines 392 to lines 194. Thus, in a read operation when data is outputted from memory device 100 (FIG. 1), DO (0-N) are DQ (0-N).

Inbound data signals or inbound data Din-0 through Din-N on lines 311 represent data inputted to input data path 111. For simplicity, Din-0 through Din-N are referred to as Din (0-N) or simply Din. Din is related to DI. Depending on the condition of the INVi code, Din may be either an inverted version or a true (non-inverted) version of DI.

Outbound data signals or outbound data Dout-0 through Dout-N on lines 322 represent data outputted by data path 122. For simplicity, Dout-0 through Dout-N are referred to as Dout (0-N) or simply Dout. DO is related to Dout. Depending on the condition of the INVo code, DO may be either an inverted version or a non-inverted version of Dout.

Inversion controller 304 controls the values of data transferred to input data path 111 and the values of data transferred from output data path 122. In some embodiments, inversion controller 304 inverts DI before DI is transferred to data input path 111 as Din. In other embodiments, inversion controller 304 inverts Dout before Dout is transferred to line 392 as DO.

In some cases, inverting DI or inverting Dout reduces the number of data switching or toggling at lines 194 of memory device 100 (FIG. 1). Reducing the number of data switching improve power consumption.

In this specification, the terms a signal level, a state, a value, and a logic value have the same meaning. The terms are used interchangeably. Further, low signal level and logic zero have the same meaning and are used interchangeably. High signal level and logic one have the same meaning and are used interchangeably.

Inverting a data means switching the signal level of the data between different signal levels. For example, when a data has a low signal level or logic zero, inverting the data means switching the low signal level of the data to a high signal level or logic one. Thus, in this example, the inverted data has a high signal level or logic one, which is an inverted version of the low signal level. As another example, when the data has a high signal level, inverting the data means switching the high signal level of the data to a low signal level. Hence, in this example, the inverted data has a low signal level, which is an inversion version of the high signal level.

Inversion controller 304 inverts DI based on the INVi code and inverts Dout based on the INVo code. Each of the INVi and INVo codes has a value. In some embodiments, the value of each of the INVi and INVo codes is represented by a signal level of a signal having a low signal level and a high signal level.

The condition or value of the INVi code indicates whether DI is to be inverted before DI is transferred to input data path 111. For example, a first condition of the INVi code (e.g., low) may indicate that the input data is not to be inverted and a second condition of the INVi code (e.g., high) may indicate that DI is to be inverted.

The condition or value of the INVo code indicates whether Dout from data path 122 is to be inverted before Dout is transferred to data transceivers 192. For example, a first condition of the INVo code (e.g., low) may indicate that Dout is not to be inverted and a second condition of the INVo code (e.g., high) may indicate that Dout is to be inverted.

Since inversion controller 304 inverts DI based on the condition of the INVi code, inversion controller 304 conditionally inverts DI. Similarly, since inversion controller 304 inverts the Dout based on the condition of the INVo code, inversion controller 304 conditionally inverts Dout.

In some embodiments, during the time that read strobe transceivers 174 are used for transferring timing information of the output data, inversion controller 304 uses write strobe transceivers 172 to receive the INVi code from lines 182. In other embodiments, during the time the write strobe transceivers 172 are used for transferring timing information of the input data, inversion controller 304 uses read strobe transceivers 174 to output the INVo code to lines 184.

Parity controller 307 generates the output parity code Po based on Dout. The Po code indicates the parity of the output data DO. Parity controller 307 also verifies the input data DI based on the input parity code Pi received from strobe transceiver circuit 170.

Each of the DI and DO has a number of bits. Each bits has a value of either logic zero or logic one. The Po code indicates whether the number of bits of DO having logic zero (or logic one) is an even number or an odd number. Similarly, the Pi code indicates whether the number of bits of DI having logic zero (or logic one) is an even number or an odd number. The Po and Pi codes are transferred via strobe transceiver circuit 170.

In some embodiments, an external device, external to memory device 100 of FIG. 1, receives DQ (0-N) and the Po code. Examples of the external device include memory controllers and microprocessors. The Po code allows the external device to verify DQ (0-N) after DO (0-N) are received by the external device.

In some embodiments, during the time that read strobe transceivers 174 are used for transferring timing information of DO, parity controller 307 uses write strobe transceivers 172 to receive the Pi code from lines 182.

In other embodiments, during the time that write strobe transceivers 172 are used for transferring timing information of DI, parity controller 307 uses read strobe transceivers 174 to output the Po code to lines 184.

Temperature reporter 310 reports temperature information of memory device 100 via strobe transceiver circuit 170. The temperature code TMP represents the temperature information. In some embodiments, a refresh rate of memory device 100 (FIG. 1) is adjusted based on the TMP code. For example, at a particular temperature or a particular range of temperature, the refresh rate may be reduced to save power.

In some embodiments, during the time that write strobe transceivers 172 are activated to transfer timing information of DI, temperature reporter 310 uses read strobe transceivers 174 to output the TMP code to lines 184.

Calibrator 313 receives a calibrating code CAL to from strobe transceiver circuit 170 to adjust a timing of data transferred by data transceiver 190. In some embodiments, during an initialization, an external device external to memory device 100 obtains the characteristic of transmission lines or channels between memory device 100 (FIG. 1) and the external device. Examples of the external devices include memory controllers and microprocessors. In some embodiments, the external device external calculates a time delay of the transmission lines and sends the calibrating code CAL to memory device 100. Based on the CAL code, calibrator 313 generates an adjust signal ADJ to allow memory device 100 to adjust (or calibrate) the timing of the output data DO to compensate for the time delay calculated by the external device. Adjusting the timing of the output data DO based on the CAL code improves the accuracy of the transfer of the output data by memory device 100.

In some embodiments, during the time that read strobe transceivers 174 are activated to transfer timing information of the input data, calibrator 313 receives the CAL code via write strobe transceivers 172.

Inversion Controller

Figure 4:
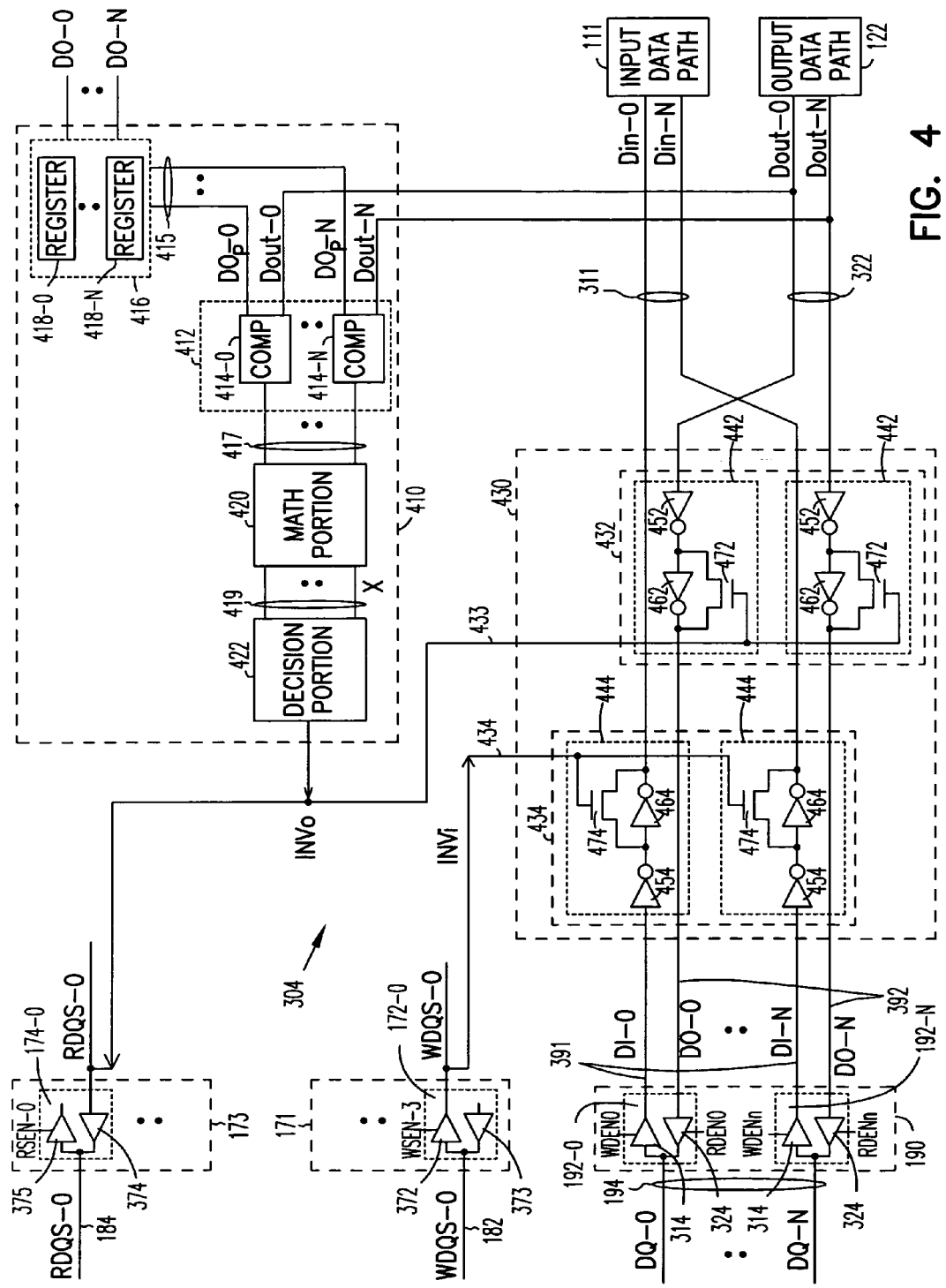
FIG. 4 is a circuit diagram of an inversion controller of FIG. 3.

FIG. 4 is a circuit diagram of inversion controller of the FIG. 3. Inversion controller 304 includes a calculating unit 410 and an inverting unit 430. Inverting unit 430 inverts the input data (DI) based on the input inverting code INVi. Inverting unit 430 also inverts the outbound data (Dout) based on the output inverting code INVo generated by calculating unit 410. INVi is provided to memory device 100 by external devices via write strobe unit 171. Examples of the external devices include memory controllers and microprocessors.

Calculating unit 410 determines whether to invert Dout and provides the INVo code to inverting unit 430 and read strobe unit 173. Calculating unit 410 includes a comparing portion 412, a storage portion 461, a math portion 420, and a decision portion 422.

Comparing portion 412 has a number of comparators 414 (414-0 to 414-N) for comparing Dout-0 to Dout-N on lines 322 with the previous output data DOp-0 to DOp-N on lines 415. DOp-0 to DOp-N are the output data on lines 392 from a previous output cycle. In some embodiments, each of the comparators 414 includes an exclusive OR logic for comparing the values of two corresponding output data.

Each of the comparators 412 compares a value of an outbound data with a value of a corresponding previous output data. For example, comparator 414-0 compares the value of Dout-0 with the value of the DOp-0. As another example, comparator 414-N compares the value of Dout-N with the value of DOp-N. In some embodiments, the value of a data (e.g., Dout-0 or DOp-0) is a value of a bit of data. The value of the bit of data may be a logic zero (low) or a logic one (high).

After the comparison, each of the comparators 414 provides a comparison result on one of the lines 417. The comparison result may be either a logic zero or a logic one. In some embodiments, the logic zero of the comparison result indicates that the values of Dout bits and the values of DOp bits are the same or matched; the logic one of comparison result indicates that the values of Dout bits and the values of DOp bits are different or mismatched. For example, if Dout-0 and DOp-0 are the same, the comparison result on line 417-0 would be the logic zero; if Dout-0 and DOp-0 are different, the comparison result on line 417-0 would be the logic one;

Storage portion 416 includes a number of registers 418 (418-0 to 418-N) to store the values of the output data represented by DOp-0 to DOp-N. After each time DO appears to lines 392, storage portion 416 replaces or updates the contents of registers 418 with DO on lines 392. Thus, DO in the current output cycle will become DOp in the next output cycle.

Math unit 418 performs a math operation on the comparison results provided on lines 417. Math unit 418 outputs a math result on lines 419. The combination of signals (or bits) on lines 419 represents a number, indicated by X, where X is an integer. X is the number of the bits of Dout that have a different value with corresponding bits DOp. For example, if the current Dout has eight bits with bit values of 00011111 and if the previous DOp is 00011100, X would be two (2) because the last two bits of Dout and the corresponding last two bits of DO have different values. As another example, if the current Dout is 00011111 and the previous DOp is 11111111, X would be three (3) because the first three bits of Dout and the first three bits of DOp have different values.

Decision portion 422 sets the value of the INVo code based on the number X on lines 419. In some embodiments, decision portion 422 sets the value of the INVo code at a first value (e.g., low) when X is less than or equal to N/2 and sets the INVo code at a second value (e.g., high) when X is greater than N/2. N is the number of the bits of the outbound data (Dout) which is also the number of the bits of the output data (DQ). For example, if N=8, the INVo code is set to a first value (e.g., low) if X is less than or equal to four (N/2=4) and the INVo code is set to the second value (e.g., high) if X is greater than four.

The INVo is provided to write strobe transceiver 172-0, which transfers the INVo code to lines 184 for external use. For example, one or more external devices connected to memory device 100 may use the INVo code for inverting the data outputted by memory device 100. The value of the INVo code on lines 184 indicates whether DQ on lines 194 is an inverted version or the non-inverted (true) version of the output data Dout on lines 322. In some embodiments, the external devices receive DQ and conditionally invert DQ based on the value of the INVo code. For example, after receiving DQ and INVo from memory device 100, the external device inverts DQ if INVo is high and leave DQ unchanged if INVo is low. Within memory device 100, the INVo code is also provided to inverting unit 430.

Inverting unit 430 includes an output inverting portion 432 and an input inverting portion 434. Output inverting portion 432 inverts the outbound data Dout based on the output inverting code INVo. Input inverting portion 434 inverts the inbound data DI based on the input inverting code INVi.

Output inverting portion 432 includes an input node 433 for receiving the INVo code, a number of data output nodes connected lines 392, and a number of switching devices 442. Each of the switching devices 442 is located on a path between one of the data transceivers 192 and output data path 122. Each switching device 442 includes two series-connected inverters 452 and 462 and a switch 472. Switch 472 connects around one of the inverters 452 and 462 to bypass one of the inverters 452 and 462.

Switching devices 442 are controlled by the INVo code. Switch 472 turns on when INVo is at one value or state (e.g., high). When switch 472 turns on, inverter 462 is bypassed. Dout from lines 322 bypasses inverter 462 and passes through only inverter 452 and switch 472 and becomes DO at lines 392. In this case, DO is an inverted version of Dout. Switch 472 turns off when INVo is at another value (e.g., low). When switch 472 turns off, inverter 462 is not bypassed. Dout from lines 322 passes both inverters 452 and 462 becomes DO at lines 392. In this case, DO is a true version of Dout.

Input inverting portion 434 includes an input node 434 for receiving the INVi code, a number of data output nodes connected lines 311, and a number of switching devices 444. Each of the switching devices 444 is located on a path between one of the data transceivers 192 and input data path 111. Each switching device 444 includes two series-connected inverters 454 and 464 and a switch 474. Switch 474 connects around one of the inverters 454 and 464 to bypass one of the inverters 454 and 464.

Switching devices 444 are controlled by the INVi code. Switch 474 turns on when INVi is at one value (e.g., high). When switch 474 turns on, inverter 464 is bypassed. DI from lines 391 bypasses inverter 464 and passes through only inverter 454 and switch 474 and becomes Din at lines 311. In this case, Din is an inverted version of DI. Switch 474 turns off when INVi is at another value (e.g., low). When switch 474 turns off, inverter 464 is not bypassed. DI from lines 391 passes both inverters 454 and 464 becomes Din at lines 311. In this case, Din is a true version of DI.

FIG. 5 shows exemplary data with inversion information. DOp is the previous output data on lines 392 (FIG. 4). Dout in Row 1 through Row 16 represent 16 different exemplary current outbound data outputted on lines 392 from data path 122. As an example, DO and Dout have eight bits, B0 through B7. The "inverted Dout" in each row is the inverted version of Dout. In FIG. 4, DO on lines 392 is not always an inverted version of Dout. The value of INVo determines whether or not Dout is inverted such that DO is an inverted version of Dout.

In FIG. 5, DOp is 00000111 indicating that bits B0 through B4 are all zeros and bits B5 through B7 are all ones. These bit values are used as a base to compare with each of the bit values of the 16 possible Dout.

X represents the numbers of differences in bit values between DOp and the corresponding eight bit values of each of the 16 Dout. For example, in comparing bit-to-bit among B0 through B7 of DOp with Dout in Row 1, there are eight differences in the bit values. Thus, X equals eight (8) in Row 1. As another example, in comparing DOp with Dout in Row 6, there are three differences in the bit values, i.e., three bits B5, B6, and B7 have different bit values Thus, X equals three (3) in Row 6.

Y represents the numbers of differences in bit values between DOp and the corresponding bit values of each of the 16 inverted Dout.

As described in FIG. 4, X is calculated by comparing unit 410. The INVo code is set based on the value of X. For example, INVo is zero when X is less than or equal to N/2 and INVo is one when X is greater than N/2 where N is the number of bits of DO (DOp or Dout). In FIG. 5, N=8. Thus, in Row 1, INVo is one (1) because X is greater than four (4). In Row 6, INVo is zero because X is less than four.

The value of INVo indicates whether the Dout is inverted. If Dout is inverted, DO is an inverted version of Dout. For example, in Row 1, since INVo is one, Dout is inverted and the inverted version of Dout is transferred to lines 392. The inverted Dout of Row 1 is 00000111. Lines 392 have the previous value DOp of 00000111, which is also equal to value of the inverted Dout 00000111. Thus, when the inverted Dout is transferred to lines 392, the value or signals on lines 392 do not need to be switched or toggled because the inverted Dout and the previous DOp have the same value. In this case, since no switching is done at lines 392, the number of switches in bit values between DOp and Dout is zero. In FIG. 5, in Row 1, Y is zero indicating the number of switches is zero.

If Dout were not inverted, the number of switches at lines 392 would have been eight as indicated by the value of X equal to eight (8) in Row 1. Thus, the example regarding row 1, inverting Dout before transferring Dout to lines 392 reduces the number of switches at lines 392 from eight to zero. Power is saved when the number of switches is reduced.

As another example, in Row 6, since INVo is zero, a non-inverted or true version of Dout is transferred to lines 392. In comparing the bits 00000000 of Dout in Row 6 with the bits 00000111 of DOp, there are three bits having different value as indicated by X equal to three in Row 6. Thus, when the true version of Dout is transferred to lines 392, the last three bits B6, B7, and B8 of Dout are switched. In the example regarding row 6, the number of switches in bit values between DOp and Dout is three. If Dout were inverted and the inverted Dout in Row 6 is transferred to lines 392, the number of switching would have been five (5) as indicated by the value of Y in Row 6. Hence, in this case, transferring the true version of Dout keeps the number of switches at three (3) which is lower than five (5) switches between the inverted Dout (Row 6) and DOp.

The examples above regarding row 1 and row 6 and the table in FIG. 5 show that depending on the value of the INVo code, an inverted version or a true version of Dout is transferred. Regardless of which version of Dout is transferred, the number of switches between bit values of the data being transferred is kept at the lowest value (between X and Y), thereby improving power consumption.

Figure 6:
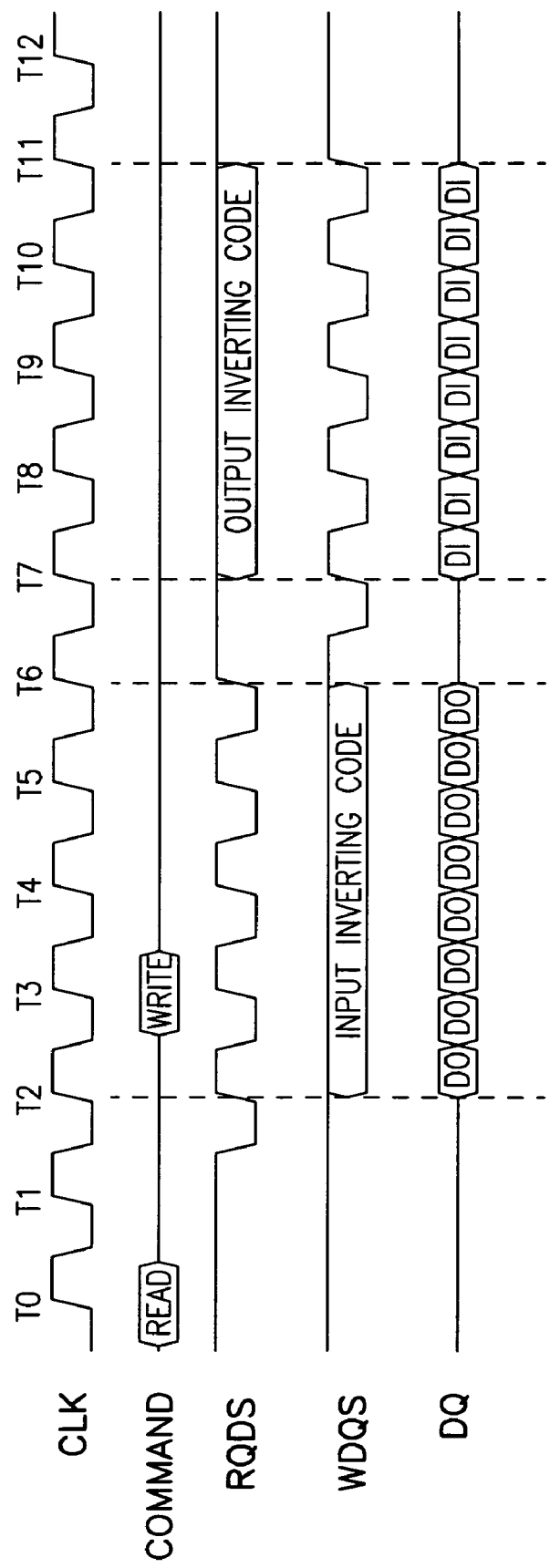
FIG. 6 is an exemplary timing diagram for the memory device of FIG. 4.

FIG. 6 is an exemplary timing diagram for the memory device of FIG. 4. CLK represents a clock signal such as the CLK signal on lines 110 (FIG. 1). The RDQS and WDQS signals represent the RDQS-0 and WDQS-0 signals of FIG. 4. DQ represents one of the DQ (0-N) of FIG. 4. In FIG. 6, DQ includes DO and DI. DO is outputted at a particular after the READ command is issued. For example, DO is outputted between times T2-T6. DI is inputted at a particular after the WRITE command is issued. For example, DI is inputted between times T7-T11.

After the READ command issued at time T0, memory device 100 outputs the output data DO between times T2-T6. The RDQS signal, which carries timing information of output data DO, is activated between times T2-T6. FIG. 6 shows that the RDQS signal switches (toggles) when it is activated between times T2-T6. Because only the output data DO are outputted between times T2-T6, only the RDQS signal is activated for carry timing information of the output data DO between times T2-T6. The WDQS is not activated to carry timing information of the input data DI until time T7. Thus, between times T2-T6 the WDQS signal may be activated to transfer the input inverting code INVi.

In a similar but reverse situation, the RDQS signal may also be activated to carry the output inverting code INVo when the input data DI is inputted. For example, between times T7-T11, the RDQS signal may be activated to carry the INVo code during the time that the input data DI is inputted. Between times T7-T11, the timing information of the input data DI is carried by the WDQS signal.

In some embodiments, the WDQS signal is partially activated to carry the INVi code such that the WDQS is activated for an interval less than the interval of the output data DO being outputted. For example, the WDQS is activated during only a portion of the interval between times T2-T6 and not the entire interval between times T2-T6. In other embodiments, the WDQS signal is activated to carry the INVi code for an interval equal to the interval of the output data DO being outputted. For example, the WDQS is activated during the entire interval between times T2-T6.

In some embodiments, the RDQS signal is partially activated to carry the INVo code such that the RDQS is activated for an interval less than the interval of the input data DI being inputted. For example, the RDQS is activated during only a portion of the interval between times T7-T11, not the entire interval between times T7-T11. In some other embodiments, the RDQS signal is activated to carry the INVo code for an interval equal to the interval of the input data DI being inputted. For example, the RDQS is activated during the entire interval between times T7-T11.

Parity Controller

Figure 7:
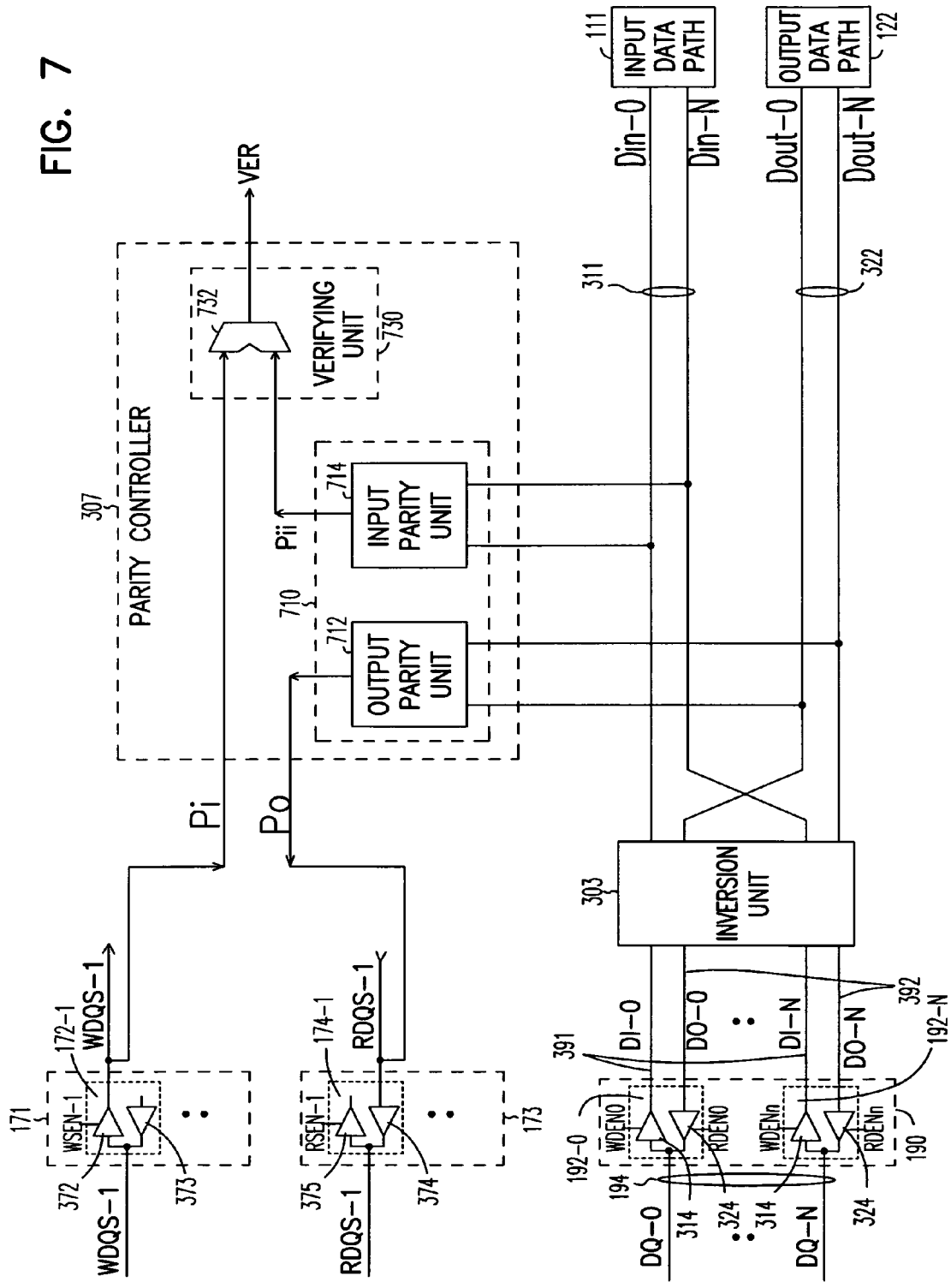
FIG. 7 is a circuit diagram of a parity controller of FIG. 3.

FIG. 7 is a circuit diagram of a parity controller of FIG. 3. Parity controller 307 includes a parity generator 710 and a verifier 730. Parity generator 710 generates the output parity code Po based on the outbound data Dout. Parity generator 710 also generates an internal input parity code Pii based on the input data DI. Verifier 730 verifies the input data based on the input parity code Pi and the internal parity code Pii.

Parity generator 710 includes an output parity unit 712 and an input parity unit 714. Output parity unit 712 generates Po based on Dout. Input parity unit 714 generates Pii based on DI. Since Po is the parity of Dout, Po is also the parity of DO because DO is generated from Dout. Since Pii is the parity of Din, Pii is also the parity of DI because Din is generated from DI. For the description of parity controller 307, output data refers to either Dout or DO and input data refers to either DI or Din.

Output parity unit 712 connects to lines 322 for receiving Dout. In some embodiments, output parity unit 712 connects to lines 392 (FIG. 3) for receiving DO. In some embodiments, output parity unit 712 includes at least one exclusive OR logic for calculating the value of Po. Output parity unit 712 provides Po to read strobe unit 173, which transfers Po to one of the lines 184. In some embodiments, read strobe transceivers 174-1 transfers Po one of the lines 184 during the time that data transceivers 192 receive the input data DI.

Input parity unit 714 connects to lines 311 for receiving Din. In some embodiments, input parity unit 714 connects to lines 391 for receiving DI. In some embodiments, input parity unit 714 includes at least one exclusive OR logic for calculating the value of Pii. Input parity unit 714 provides Pii to verifier 730.

Verifier 730 includes a comparator 732 for comparing Pii with Pi. As described above, Pii is generated internally by input parity unit 714. Pi is provided externally on lines 182 by a device external to memory device 100 (FIG. 1). Examples of the external device include memory controllers and microprocessors.

Comparator 732 generates a verification code VER based on the result of the comparison between Pii and Pi. The VER code indicates the validity of the input data. For example, in one state (e.g., low), the VER code indicates that the input signal is invalid; and in another state (e.g., high), the VER code indicates that the input signal is valid. The VER code is provided to control circuit 118 (FIG. 1).

If the VER code indicates that the input data is invalid, control circuit 118 notifies input data path 111 to ignore the input data and control circuit 118 requests the input data to be transferred again to lines 194 of memory device 100. If the VER code indicates that the input data is valid, input data path 111 transfers the input data to memory array 102 (FIG. 1).

FIG. 8 shows exemplary data with parity information. Bits B0 to B7 represent the bits of either the input data or the output data. As described above in FIG. 7, the output data may by either Dout or DO and the input data may by either DI or Din. The parity bit P may represent the value of the output parity bit Po, the input parity bit Pi, or the internal input parity bit Pii. FIG. 8 shows eight bits B0-B7 as an example. The number of bits can be varied.

The parity bit P is either zero (logic zero) or one (logic one). In the exemplary data of FIG. 8, P is zero when bits B0 to B7 has an even number of zero bits (or ones bits); and P is one when bits B0 to B7 has an odd number of zero bits (or ones bits). For example, in row 1 and row 3, P is zero because each of the data in row 1 and row 3 has an even number of zero (or one) bits. As another example, in row 6 and row 14, P is one because each of the data in row 6 and row 14 has an odd number of zero (or one) bits.

In the above example, P is zero when bits B0 to B7 has an even number of zero bits (or ones bits); and P is one when bits B0 to B7 has an odd number of zero bits (or ones bits). In some embodiments, P is zero when bits B0 to B7 has an odd number of zero bits (or ones bits); and P is one when bits B0 to B7 has an even number of zero bits (or ones bits).

Figure 9:
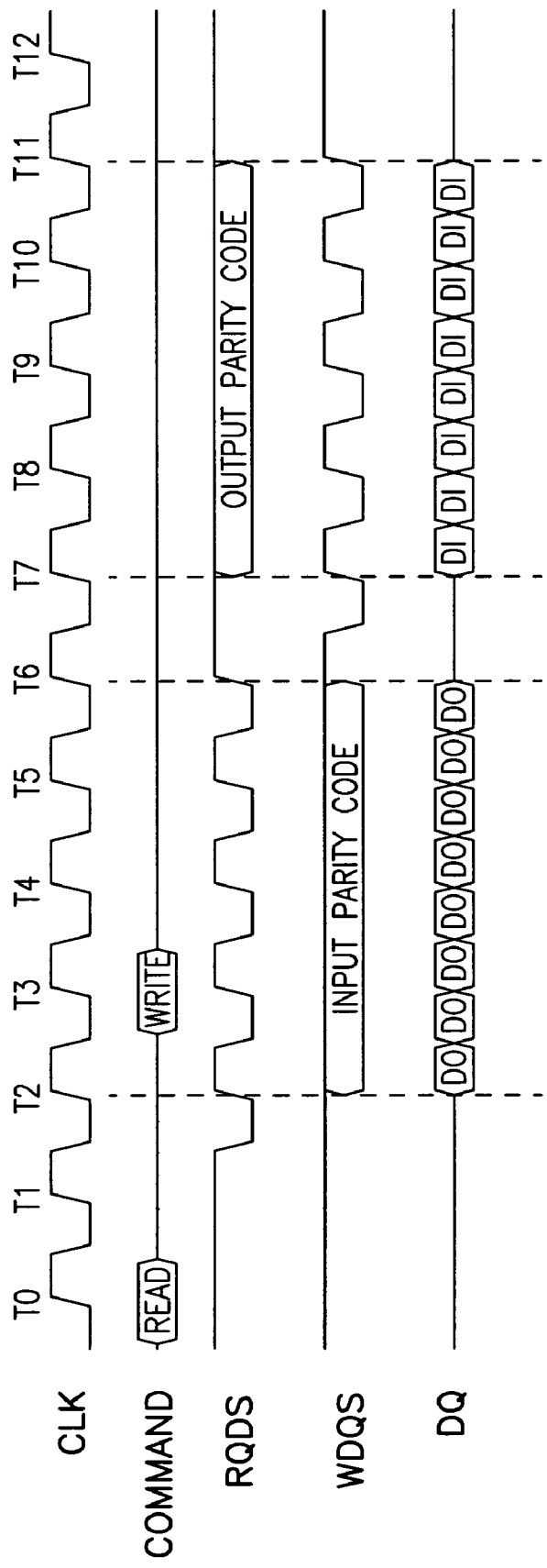
FIG. 9 is an exemplary timing diagram for the memory device of FIG. 7.

FIG. 9 is an exemplary timing diagram for the memory device of FIG. 7. CLK represents a clock signal such as the CLK signal on lines 110 (FIG. 1). The RDQS and WDQS signals represent the RDQS-1 and the WDQS-1 signal of FIG. 7. DQ represents one of the DQ (0-N) of FIG. 7. In FIG. 9, DQ includes DO and DI. DO is outputted at a particular after the READ command is issued. For example, DO is outputted between times T2-T6. DI is inputted at a particular after the WRITE command is issued. For example, DI is inputted between times T7-T11.

After the READ command issued at time T0, memory device 100 outputs the output data DO between times T2-T6. The RDQS signal, which carries timing information of output data DO, is activated between times T2-T6. FIG. 9 shows that the RDQS signal switches (toggles) when it is activated between times T2-T6. Because only the output data DO are outputted between times T2-T6, only the RDQS signal is activated for carry timing information of the output data DO between times T2-T6. The WDQS is not activated to carry timing information of the input data DI until time T7. Thus, between times T2-T6 the WDQS signal may be activated to carry the input parity code Pi.

In a similar but reverse situation, the RDQS signal may also be activated to carry the output parity Po when the input data DI is inputted. For example, between times T7-T11, the RDQS signal may be activated to carry the Po code during the time that the input data DI is inputted. Between times T7-T11, the timing information of the input data DI is carried by the WDQS signal.

In some embodiments, the WDQS signal is partially activated to carry the Pi code such that the WDQS is activated for an interval less than the interval of the output data DO being outputted. For example, the WDQS is activated during only a portion of the interval between times T2-T6 and not the entire interval between times T2-T6. In other embodiments, the WDQS signal is activated to carry the Pi code for an interval equal to the interval of the output data DO being outputted. For example, the WDQS is activated during the entire interval between times T2-T6.

In some embodiments, the RDQS signal is partially activated to carry the Po code such that the RDQS is activated for an interval less than the interval of the input data DI being inputted. For example, the RDQS is activated during only a portion of the interval between times T7-T11, not the entire interval between times T7-T11. In some other embodiments, the RDQS signal is activated to carry the Po code for an interval equal to the interval of the input data DI being inputted. For example, the RDQS is activated during the entire interval between times T7-T11.

Temperature Reporter

Figure 10:
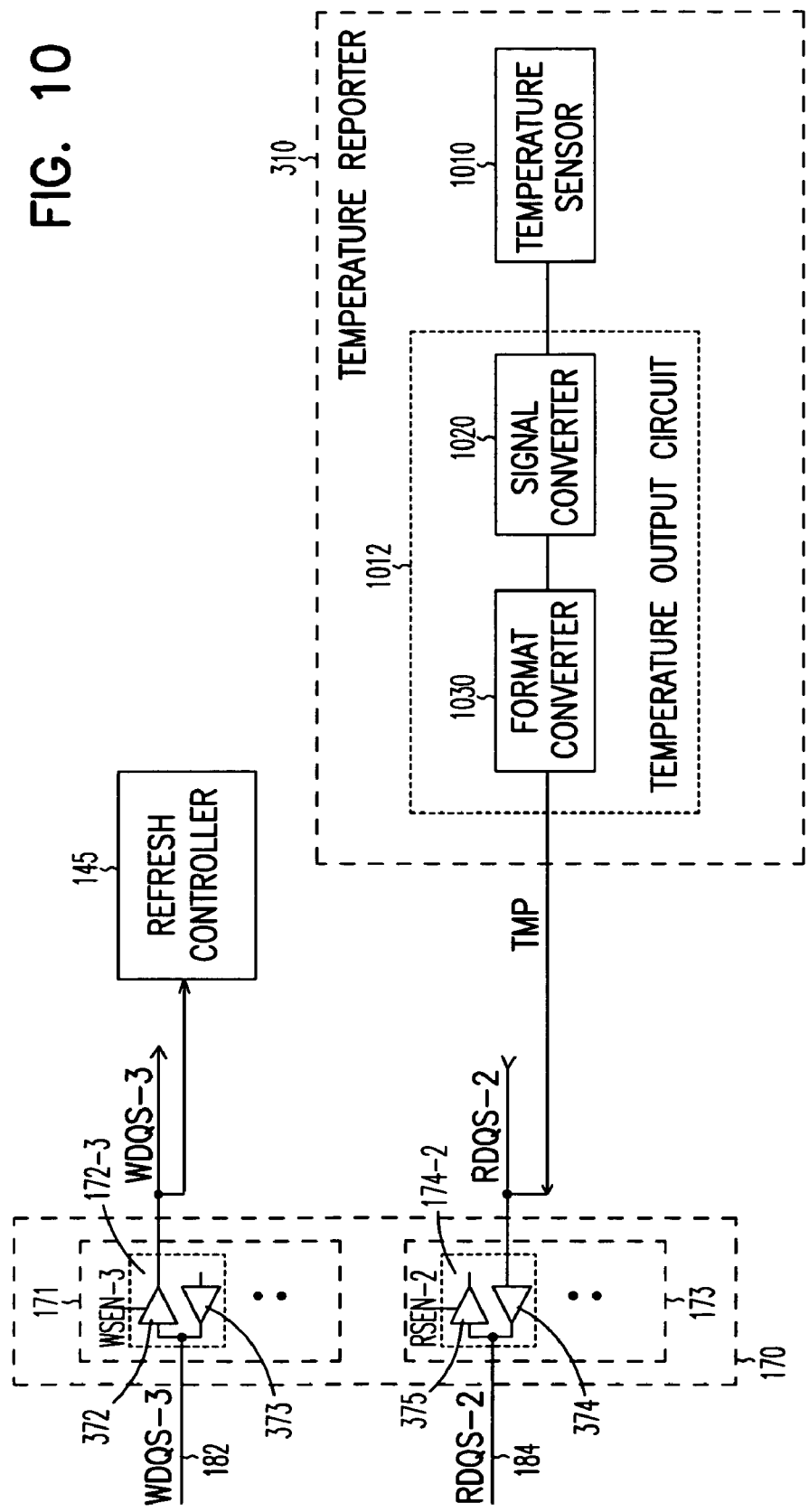
FIG. 10 is a circuit diagram of a temperature reporter of FIG. 3.

FIG. 10 is a circuit diagram of a temperature reporter of FIG. 3. Temperature reporter 310 includes a temperature sensor 1010 for sensing the temperature of device 100 (FIG. 1) and a temperature output circuit 1012 for outputting the temperature data or temperature information.

Temperature sensor 1010 senses the temperature of memory device 100 (FIG. 1) and produces temperature data. In some embodiments, the temperature data is an analog temperature data.

Temperature output circuit 1012 includes a signal converter 1020, and a format converter 1030. Signal converter 1020 produces a digital temperature data sensed by temperature sensor 1010. In some embodiments, signal converter 1020 includes an analog to digital converter for converting an analog temperature data into a digital temperature data. In some embodiments, signal converter 1020 produces the digital temperature data in a parallel format.

Format converter 1030 produces a digital temperature data in a serial format. In some embodiments, format converter 1030 includes a parallel to serial converter for converting a digital temperature data having a parallel format into a digital temperature data having a serial format.

The temperature code TMP represents the digital temperature data having a serial format. In some embodiments, the TMP code includes multiple temperature code bits. The combination of the multiple temperature code bits represents the temperature of memory device 100 (FIG. 1). For example, if the number of the multiple code bits is eight (8) each of the 256 ($2^8$) combinations represents one temperature of memory device 100 (FIG. 1).

Format converter 1030 provides the TMP code to read strobe transceiver 174-2. Read strobe transceiver 374-2 transfers the TMP code to lines 184.

In some embodiments, an external device external to memory device 100 (FIG. 1) receives the TMP code to control a refresh rate of memory device 100. The refresh rate is the rate or frequency at which refresh controller 145 (FIG. 1) refreshes memory cells 103. Examples of the external device include memory controllers and microprocessors. In some embodiments, the external device may provide refresh control signals on lines 182 to memory device 100 via a write strobe transceiver such as write strobe transceiver 172-3. Memory device 100 uses the refresh control signals to control the refresh rate. For example, at some temperature such as a temperature lower than a normal operating temperature of memory device 100, refresh controller 145 may reduce the activation of the REFRESH signal to reduce the refresh rate to save power.

FIG. 11 shows exemplary temperature information. TB0 to TB7 represent the multiple temperature code bits of the TMP code. FIG. 11 shows the TMP code having eight temperature code bits (TB0-TB7) as an example. In some embodiments, the number of temperature code bits TB of the TMP code can be different from eight.

Each combination of TB0-TB7 represents a different temperature. FIG. 11 shows eight different combinations of TB0-TB7 (COL 1 to COL 8) representing eight different temperatures (bottom row). For example, in COL 2, TB0-TB7 has the combination 00000001, which represents 15 degree Celsius. As another example, in COL 8, TB0-TB7 has the combination 01111111, which represents 105 degree Celsius. Since the TMP code has eight bits TB0-TB7, 256 possible combinations of TB0-TB7 can be obtained. FIG. 11 shows eight combinations of TB0-TB7 as an example, other combinations among the 256 combinations of TB0-TB7 can be used to represent other temperatures different from the temperatures shown in FIG. 11.

Temperature reporter 310 (FIG. 10) provides the multiple temperature code bits TB0-TB7 of the TMP code to read strobe transceivers 174 for outputting to lines 184. In some embodiments, each of the eight bits TB0-TB7 is outputted to lines 184 in one cycle of a clock signal. Thus, in some embodiments, the number of clock cycles used to output the TMP code equals the number of the multiple temperature code bits TB. For example, in FIG. 11, since the TMP code has eight bits, TB0-TB7, eight cycles of clock are used to output the TB0-TB7 bits.

Figure 12:
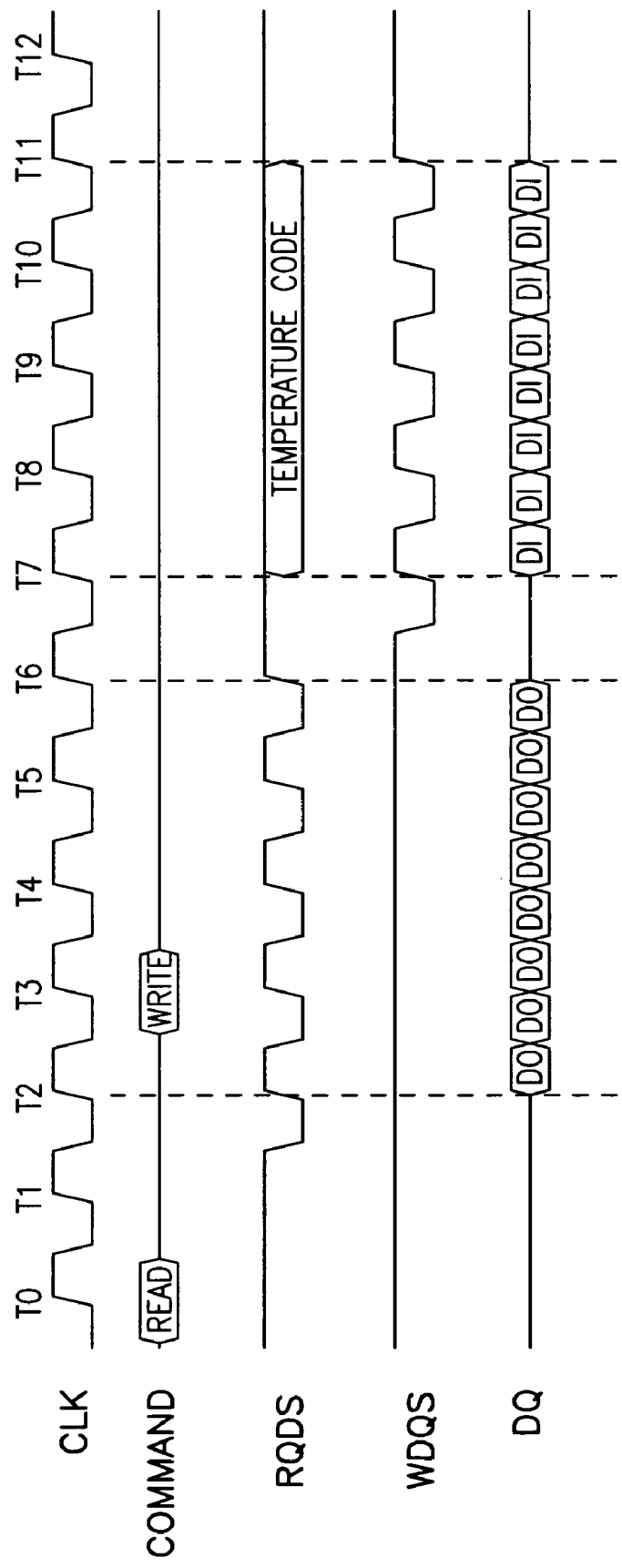
FIG. 12 is an exemplary timing diagram for the memory device of FIG. 10.

FIG. 12 is an exemplary timing diagram for the memory device of FIG. 10. CLK represents a clock signal such as the CLK signal on lines 110 (FIG. 1). The RDQS signal represents the RDQS-2. The WDQS signal represents one of the WDQS (0-M) signals. DQ represents one of the DQ (0-N) of FIG. 10. In FIG. 12, DQ includes DO and DI. DO is outputted at a particular after the READ command is issued. For example, DO is outputted between times T2-T6. DI is inputted at a particular after the WRITE command is issued. For example, DI is inputted between times T7-T11.

After the READ command issued at time T0, memory device 100 outputs the output data DO between times T2-T6. The RDQS signal, which carries timing information of output data DO, is activated between times T2-T6. FIG. 12 shows that the RDQS signal switches (toggles) when it is activated between times T2-T6. Because only the output data DO are outputted between times T2-T6, only the RDQS signal is activated for carry timing information of the output data between times T2-T6. The WDQS is not activated to carry timing information of the input data until time T7.

Between times T7-T11, the WDQS signal is activated to carry timing information of the input signal DI. Because only the input data DI are outputted between times T7-T11, only the WDQS signal is activated, the RDQS signal is not activated for carry timing information. However, between times T7-T11, the RDQS may be activated to carry the temperature code TMP code.

In some embodiments, the RDQS signal is partially activated to carry the TMP code such that the RDQS is activated for an interval less than the interval of the input data DI being inputted. For example, the RDQS is activated during only a portion of the interval between times T7-T11, not the entire interval between times T7-T11. In some other embodiments, the RDQS signal is activated to carry the TMP code for an interval equal to the interval of the input data DI being inputted. For example, the RDQS is activated during the entire interval between times T7-T11.

Calibrator

Figure 13:
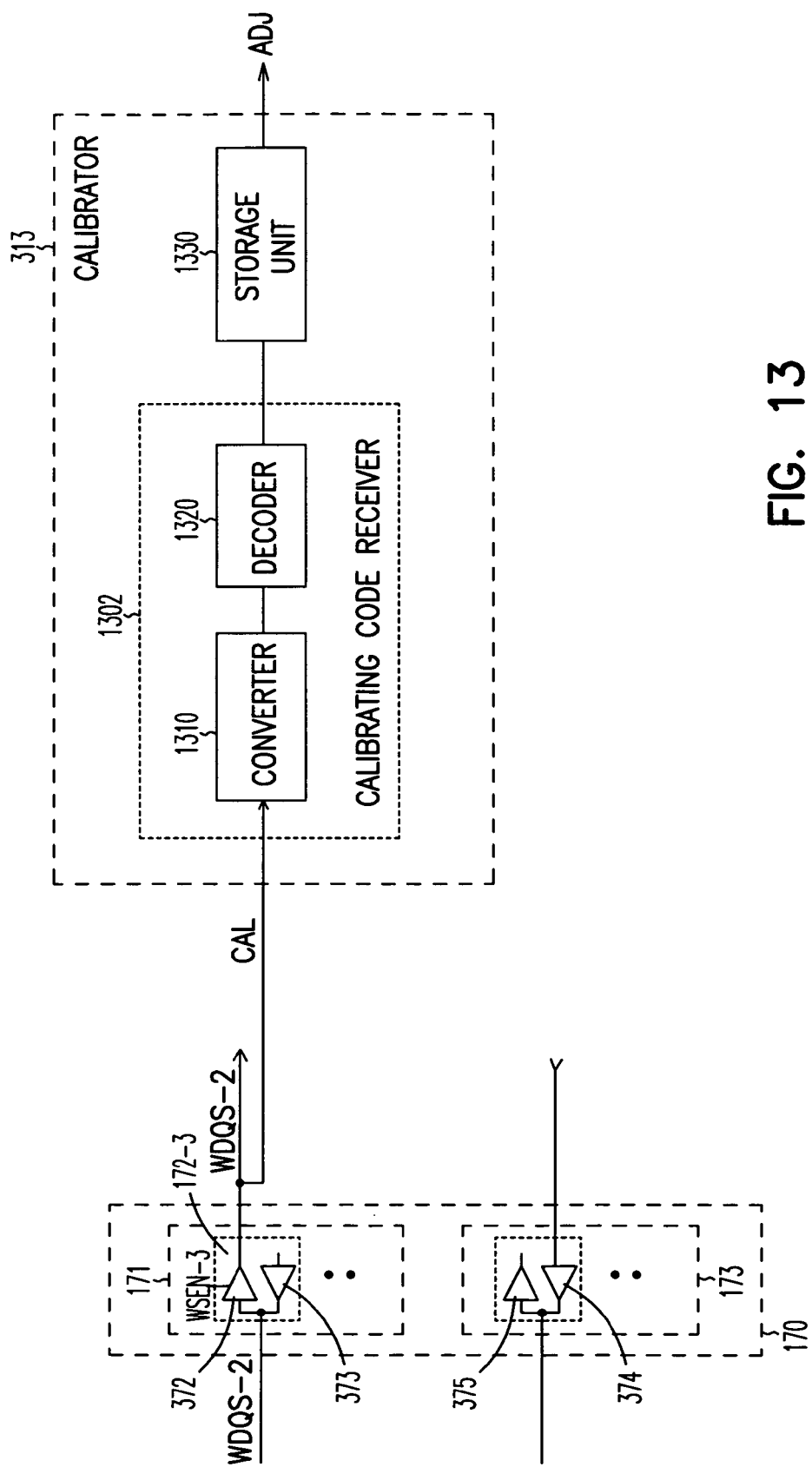
FIG. 13 is a circuit diagram of a calibrator of FIG. 3.

FIG. 13 is a circuit diagram of a calibrator of FIG. 3. Calibrator 313 receives a calibrating code CAL from transceiver circuit 170. The CAL code represents a timing delay. In some embodiments, the CAL code is provided by an external device external to memory device 100. Examples of the external device include memory controllers and microprocessors.

Calibrator 313 includes a calibrating code receiver 1302 and a storage unit 1330. Calibrating code receiver 1302 includes a converter 1310 and a decoder 1320. Converter 1310 receives a calibrating code CAL from strobe transceiver circuit 170. The CAL code includes multiple calibrating code bits. A combination of the multiple calibrating code bits represents a time delay. In some embodiments, converter 1310 converts the calibrating code bits of the CAL code to a parallel format. Decoder 1320 decodes of the calibrating code bits of the CAL code to provide calibrating data or calibrating information representing the timing delay.

Storage unit 1330 stores the timing delay provided by decoder 1320. Based on the timing delay, storage unit 1330 sends an adjust signal ADJ to control circuit 118 (FIG. 1). In some embodiments, the ADJ signal has multiple bits and the combination of the multiple bits corresponds to the timing delay stored in storage unit 1330. Based on the ADJ signal, controller 118 controls the data read enable signal RDEN (FIG. 1 and FIG. 3) to adjust the timing of the transfer of data from data transceiver circuit 190.

In some embodiments, the external device (e.g., memory controller or processor) sends the CAL code to memory device during a calibrating process or an initialization process. In the calibrating process, the external device may send different CAL codes to memory device 100. In response to the different CAL codes, memory device 100 may transfer multiple output data in multiple data transfers to the external device at different times. Each time, each of the multiple output data has different timing delay corresponding one of the different CAL codes. The external device may detect the most accurate data transfer among the multiple data transfers by memory device 100. In some embodiments, after the most accurate data transfer is detected, the external device sends memory device 100 a final CAL code representing a timing delay corresponding to the most accurate data. Storage unit 1300 of calibrator 313 stores the final CAL code. Based on the final CAL code, controller 118 adjusts the timing of transceivers 190 such that after the calibrating process, subsequent data transfer from memory device 100 to the external device has the most accurate data transferred.

FIG. 14 shows exemplary calibrating timing information. CB0 to CB7 represent the multiple calibrating code bits of the CAL code. FIG. 13 shows the CAL code has eight calibrating code bits (CB0-CB7) as an example. In some embodiments, the number of calibrating code bits of the CAL code can be different from eight.

Each combination of CB0-CB7 represents a different timing delay. FIG. 13 shows eight different combinations of CB0-CB7 (COL 1 to COL 8) representing eight different timing delays (bottom row). For example, in COL 2, CB0-CB7 have the combination 00000001, which represents 150 picosecond delay. As another example, in COL 8, CB0-CB7 have the combination 01111111, which represents 200 picosecond delay. In FIG. 13, the ADJ signal may includes multiple bits to represent the timing delay such as the 150 picosecond delay or the 200 picosecond delay given in the two examples above.

In FIG. 14, since the CAL code has eight bits CB0-CB7, 256 possible combinations of CB0-CB7 can be obtained. FIG. 14 shows eight combinations of CB0-CB7 as an example, other combinations among the 256 combinations of CB0-CB7 can be used to represent other timing delays different from the timing delays shown in FIG. 13.

Calibrator 313 (FIG. 13) receives the multiple calibrating code bits CB0-CB7 of the CAL code from lines 182 via write strobe transceivers 172. In some embodiments, each of the eight bits CB0-CB7 is received from lines 182 in one cycle of a clock signal. Thus, in some embodiments, the number of clock cycles used to receive the CAL code equals the number of the multiple calibrating coded bits. For example, in FIG. 13, since the CAL code has eight bits, CB0-CB7, eight cycles of clock are used to receive the CB0-CB7 bits.

Figure 15:
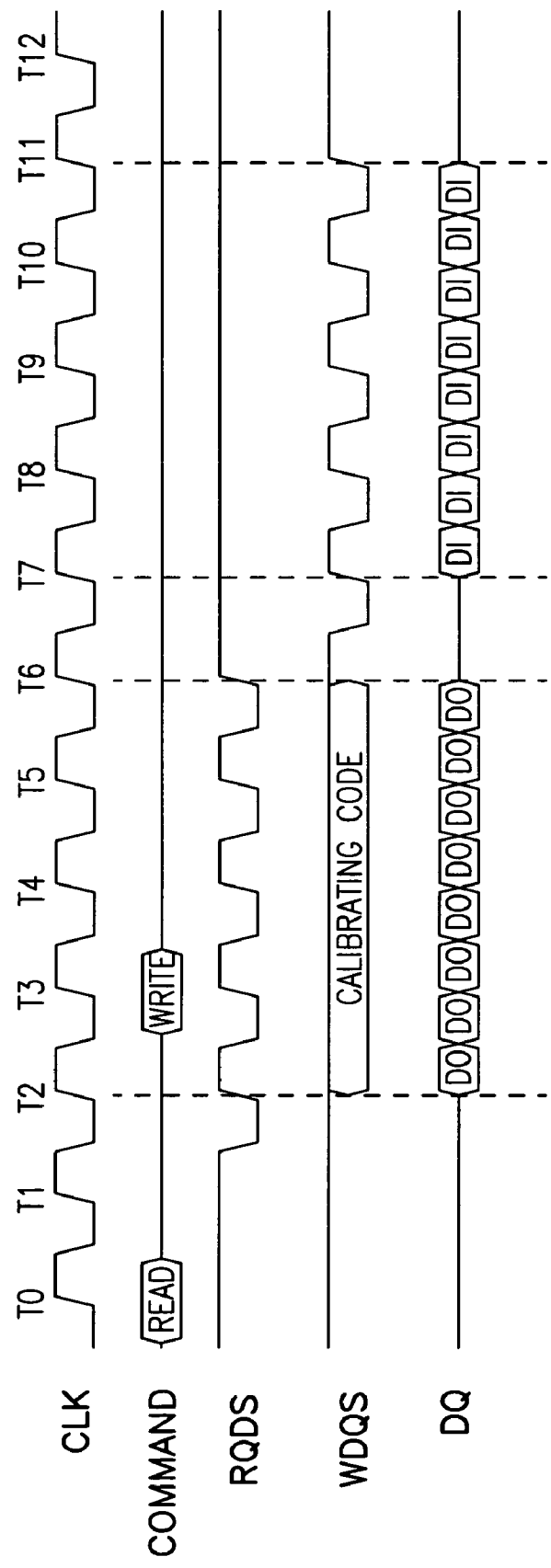
FIG. 15 is an exemplary timing diagram for the memory device of FIG. 13.

FIG. 15 is an exemplary timing diagram for the memory device of FIG. 13. CLK represents a clock signal such as the CLK signal on lines 110 (FIG. 1). The RDQS signal represents one of the RDQS (0-M) signals. The WDQS signal represents the WDQS-2 signal. DQ represents one of the DQ (0-N) of FIG. 1. In FIG. 15, DQ includes DO and DI. DO is outputted at a particular after the READ command is issued. For example, DO is outputted between times T2-T6. DI is inputted at a particular after the WRITE command is issued. For example, DI is inputted between times T7-T11.

After the READ command issued at time T0, memory device 100 outputs the output data DO between times T2-T6. The RDQS signal, which carries timing information of output data DO, is activated between times T2-T6. FIG. 15 shows that the RDQS signal switches (toggles) when it is activated between times T2-T6. Because only the output data DO are outputted between times T2-T6, only the RDQS signal is activated for carry timing information of the output data between times T2-T6. The WDQS is not activated to carry timing information of the input data until time T7. Thus, between times T2-T6 the WDQS signal may be activated to carry the CAL code.

In some embodiments, the WDQS signal is partially activated to carry the CAL code such that the WDQS is activated for an interval less than the interval of the output data DO being outputted. For example, the WDQS is activated during only a portion of the interval between times T2-T6 and not the entire interval between times T2-T6. In some other embodiments, the WDQS signal is activated to carry the CAL code for an interval equal to the interval of the input data DO being outputted. For example, the WDQS is activated during the entire interval between times T2-T6.

Figure 16:
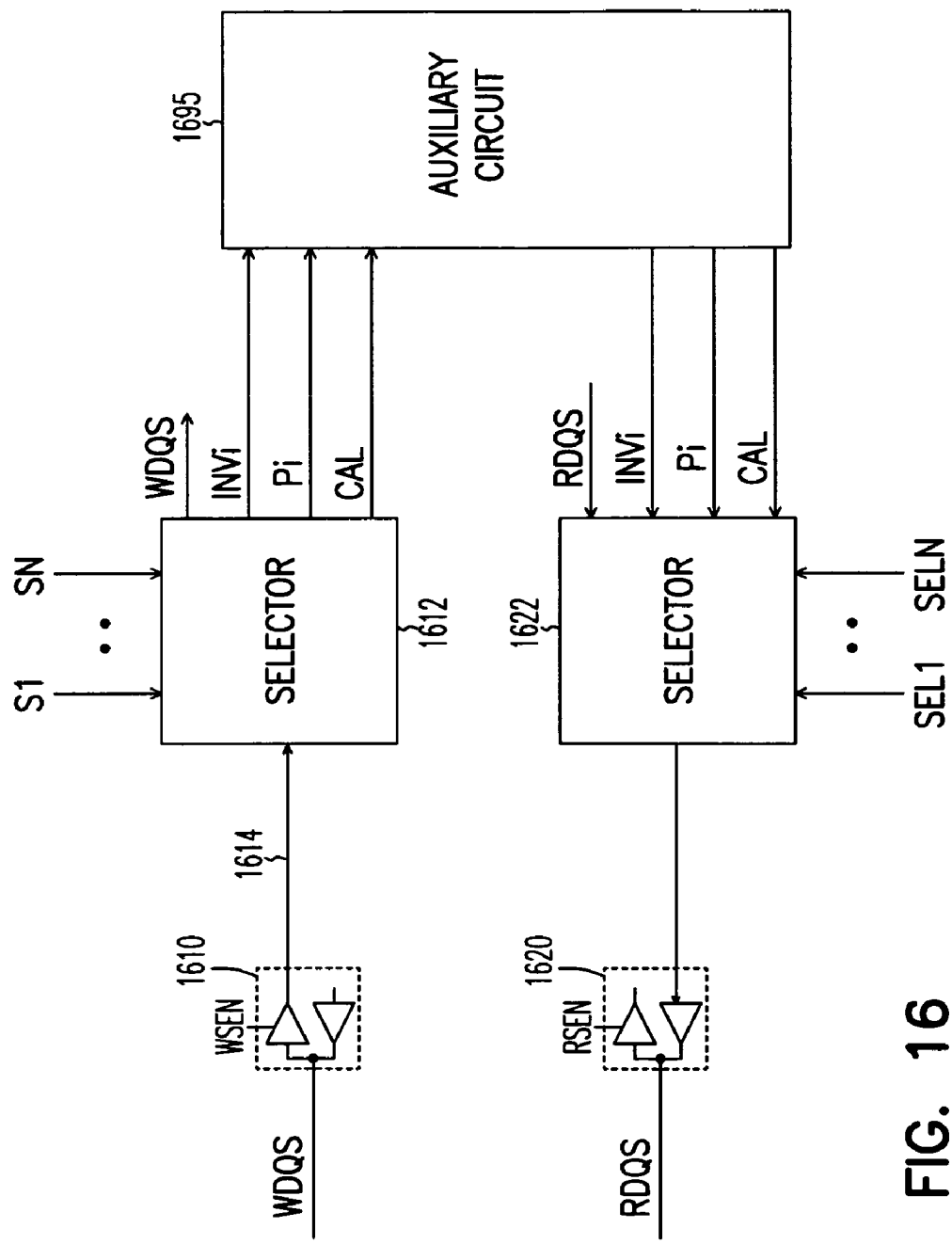
FIG. 16 shows an alternative embodiment of the auxiliary circuit and the transceiver circuits of FIG. 3.

FIG. 16 shows an alternative embodiment of the auxiliary circuit and the transceiver circuits of FIG. 3. FIG. 16 omits some of the elements of FIG. 3 for clarity. In FIG. 16, only one of the write transceivers and only one of the read transceivers are used to transfer the auxiliary information between strobe transceiver circuit 170 and auxiliary circuit 1695. Transceiver 1610 represents one of the write strobe transceivers 172 of FIG. 3. Transceiver 1620 represents one of the read strobe transceivers 174 of FIG. 3. Auxiliary circuit 1695 represents auxiliary circuit 195 of FIG. 3.

In FIG. 16, a selectors 1612 receives a signal on line 1614 provided by transceiver 1610. The signal on line 1641 may be one of the WSDQS, INVi, Pi, and CAL signals. In some embodiments, selector 1612 includes a decoder to decode select signals S1 through SN. In some embodiments, the S1 through SN signals are provided by controller 118 of FIG. 1. Each combination of the S1 through SN signals enables selector 1612 to activate one of the signals the WSDQS, INVi, Pi, and CAL. WSDQS represents one of the WDQS-0 through WDQS-3 of FIG. 3. INVi, Pi, and CAL correspond to the first group of the auxiliary information described in FIG. 3. Thus, based on the combination the S1 through SN signals, selector 1612 appropriately activates one of the output signals WSDQS, INVi, Pi, and CAL for further processing.

A selector 1622 selects one of the signals RSDQS, INVo, Po, and TEMP. In some embodiments, selector 1612 includes a multiplexer. RSDQS corresponds to one of the RDQS-0 through RDQS-3 of FIG. 3. The INVo, Po, and TMP correspond to the second group of the auxiliary information described in FIG. 3. The selection by selector 1622 is based on select signals SEL1 through SELN. In some embodiments, the SEL1 through SELN signals are provided by controller 118 of FIG. 1. Each combination of the SEL1 through SELN signals enables selector 1622 to select one of the RSDQS, INVo, Po, and TEMP and passes the selected signal to read strobe transceiver 1620.

Figure 17:
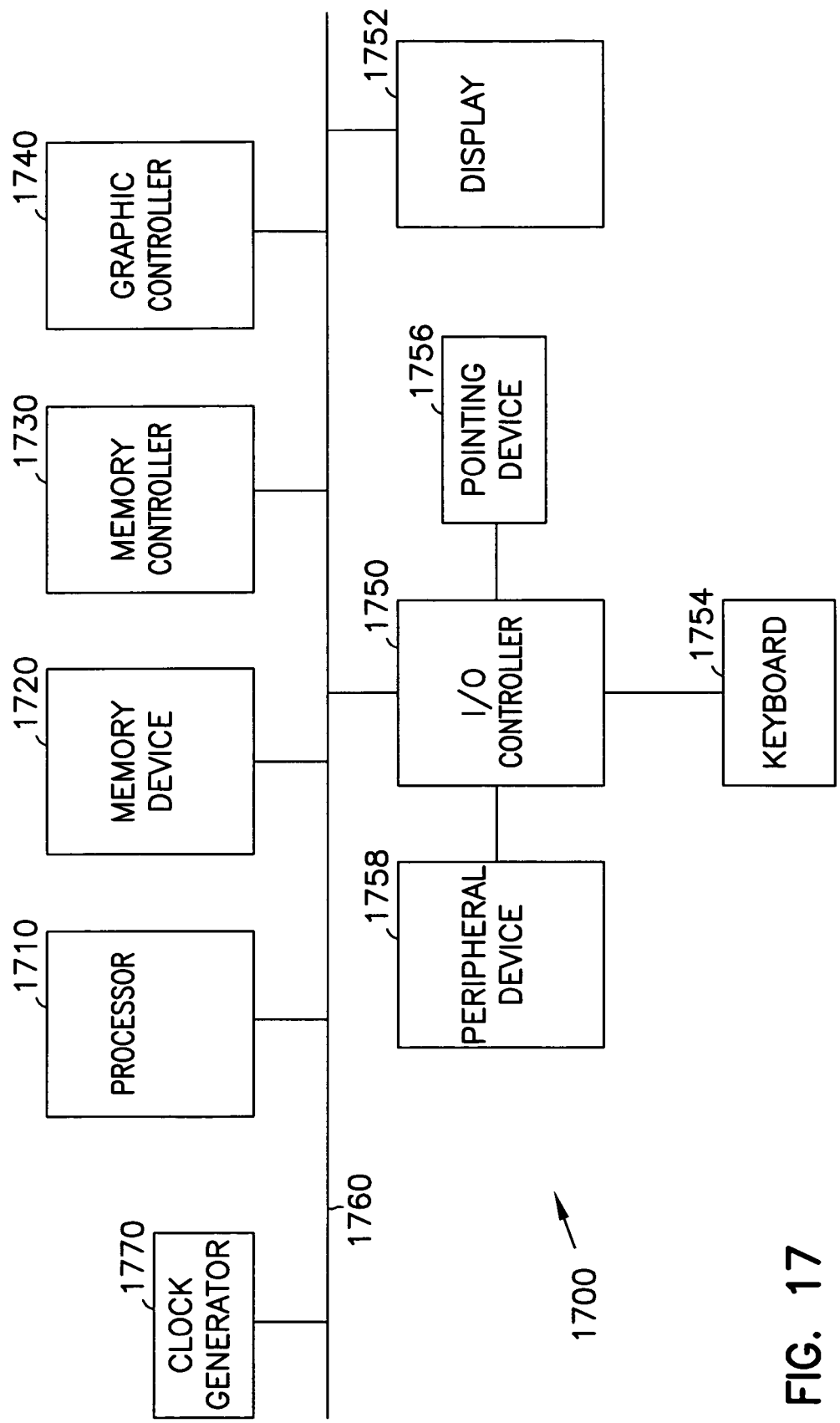
FIG. 17 shows a system according to an embodiment of the invention.

FIG. 17 shows a system 1700. System 1700 includes a processor 1710, a memory device 1740, a control circuit 1730, a graphic controller 1740, and an input and output (I/O) controller 1750, a display 1752, a keyboard 1754, a pointing device 1756, and a peripheral device 1758. A bus 1760 couples all of these devices together. A clock generator 1770 provides a clock signal to at least one of the devices of system 1700 via bus 1760. An example of clock generator 1770 includes an oscillator in a circuit board such as a motherboard. Two or more devices shown in system 1700 may be formed in a single chip.

Memory device 1740 includes memory device 100 (FIG. 1). Further, at least one of the devices shown in system 1700 includes an auxiliary circuit such as auxiliary circuit 195 (FIG. 1 through FIG. 16) for transferring auxiliary information via strobe transceiver circuit such as strobe transceiver circuit 170.

Bus 1760 may be interconnect traces on a circuit board or may be one or more cables. Bus 1760 may also couple the devices of system 1700 by wireless means such as by electromagnetic radiations, for example, radio waves. Peripheral device 1758 may be a printer, an optical device such as CD-ROM and DVD reader and writer, a magnetic device reader and writer such as a floppy disk driver, or an audio device such as a microphone.

System 1700 represented by FIG. 17 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods for performing various functions using data strobe transceivers of a memory device.

One aspect includes a memory device having a number of data transceivers for transferring an input data and out output data. A number of write strobe transceivers transfers timing of the input data. A number of read strobe transceivers transfers timing information of the output data. An auxiliary circuit transfers auxiliary information via the read strobe transceivers and the write strobe transceivers. The auxiliary information is a non-timing information of the input and output data. Examples of the auxiliary information include inverting codes, parity codes, temperature codes, and timing calibrating codes.

Another aspect includes a method of transferring data in a memory device. The method transfers input and output data to and from the memory device via data transceivers. The method transfers timing information of the input data via write strobe transceivers. The method transfers timing information of the output data via read strobe transceivers. The method uses the read strobe transceivers to transfer auxiliary information during the time that the write strobe transceivers transfer the timing information of the input data. The method uses the write strobe transceivers to transfer auxiliary information during the time that the read strobe transceivers transfer the timing information of the output data.

Although specific embodiments are described herein, those skilled in the art recognize that other embodiments may be substituted for the specific embodiments shown to achieve the same purpose. This application covers any adaptations or variations of the embodiments of the present invention.

Therefore, the embodiments of the present invention are limited only by the claims and all available equivalents.

What is claimed is:

1. A memory device comprising:
a data transceiver for transferring input data and output data;
a write strobe transceiver for transferring timing information of the input data;
a read strobe transceiver for transferring timing information of the output data; and
an auxiliary circuit connected to at least one of the write strobe receiver or the read strobe transceiver for generating auxiliary information, wherein at least one of the write strobe transceiver and the read strobe transceiver is also for transferring the auxiliary information during at least a portion of a time the other of the at least one of the write strobe transceiver and the read strobe transceiver is used for transferring timing information.

2. The device of claim 1, wherein the auxiliary circuit includes an inversion controller for conditionally inverting the input and output data.

3. The device of claim 1, wherein the auxiliary circuit includes a parity controller for generating a parity code of the output data.

4. The device of claim 1, wherein the auxiliary circuit includes a temperature reporter for generating temperature information of the device.

5. The device of claim 1, wherein the auxiliary circuit includes a calibrator for calibrating a timing of a transfer of the output data.

6. The device of claim 1, wherein the write strobe transceiver includes at least one write strobe receiver connected to the auxiliary circuit.

7. The device of claim 6, wherein the read strobe transceiver includes at least one read strobe transmitter connected to the auxiliary circuit.

8. The device of claim 1, wherein the output data is generated based on outbound data, and the auxiliary circuit comprises an inversion controller connected to the data transceiver and the write and read strobe transceivers for conditionally inverting the input data and for conditionally inverting the outbound data, and wherein the write strobe transceiver is also for transferring an input inverting code and the read strobe transceiver being also for transferring an output inverting code.

9. The device of claim 8, wherein the inversion controller includes:
a calculating unit for generating the output inverting code based on the outbound data; and
an inverting unit for inverting the outbound data based on the output inverting code and for inverting the input data based on the input inverting code.

10. The device of claim 9, wherein the read strobe transceiver includes at least one read strobe transmitter connected to the inversion controller for transferring the output inverting code.

11. The device of claim 10, wherein the write strobe transceiver includes at least one write strobe receiver connected to the inversion controller for transferring the input inverting code.

12. The device of claim 8, wherein the data transceiver, the write strobe transceiver, and the read strobe transceiver include identical circuit elements.

13. The device of claim 8, wherein the data transceiver includes a receiver and a transmitter, the write strobe transceiver includes a receiver and a transmitter, and the read strobe transceiver includes a receiver and a transmitter.

14. The device of claim 8, further comprising:
a memory array for receiving inbound data and for outputting the outbound data;
an input data path for transferring the inbound data to the memory array, wherein the input data is transferred to the input data path as the inbound data; and
an output data path for transferring the outbound data from the memory array.

15. The device of claim 14, wherein the inversion controller includes an inverting unit connected between the data transceiver and the input path and output data path.

16. The device of claim 15, wherein the inverting unit includes a first switching device, the first switching device including:
an inverter connected between the data transceiver and the input path; and
a switch connected around the inverter for allowing data to bypass the inverter based on the input inverting code.

17. The device of claim 16, wherein the inverting unit further includes a second switching device, the second switching device including:
an inverter connected between the data transceiver and the output path; and
a switch connected around the inverter for allowing data to bypass the inverter based on the output inverting code.

18. The device of claim 15, wherein the inversion controller further includes a calculating unit for generating the output inverting code based on the outbound data.

19. The device of claim 18, wherein the calculating unit includes a comparing portion for comparing the outbound data of a first output cycle with the outbound data of a second output cycle.

20. The device of claim 1, wherein the write strobe transceiver is also for receiving an input parity code of the input data, and the read strobe transceiver being also for transferring an output parity code of the output data, and wherein the auxiliary circuit comprises a parity controller connected to the data transceiver and the write and read strobe transceivers for generating the output parity code and for verifying the input data based on the input parity code.

21. The device of claim 20, wherein the parity controller includes:
a parity generator for generating the output parity code based on the output data and for generating a calculated input parity code based on the input data; and
a verifier for verifying the input data based on the calculated input parity and the input parity code.

22. The device of claim 21, wherein the read strobe transceiver includes at least one read strobe transmitter connected to the parity controller for transferring the output parity code.

23. The device of claim 22, wherein the write strobe transceiver includes at least one write strobe receiver connected to the parity controller for transferring the input parity code.

24. The device of claim 23, further comprising:
a memory array for receiving inbound data and for outputting outbound data, the output data being generated based on the outbound data;
an input data path for transferring the inbound data to the memory array, the input data being transferred to the input path as the inbound data; and
an output data path for transferring the outbound data from the memory array.

25. The device of claim 24, wherein the parity controller includes an output parity unit connected to the data transceiver for generating the output parity code based on the output data, and connected to the read strobe transceiver for providing the output parity code to the read strobe transceiver.

26. The device of claim 25, wherein the parity controller further includes an input parity unit connected to the data transceiver for generating a calculated input parity code based on the input data.

27. The device of claim 26, wherein the parity controller further includes a comparator for comparing the input parity code and the calculated input parity code.

28. The device of claim 1, wherein the read strobe transceiver is also for transferring temperature information, and the device further comprising a temperature reporter connected to the read strobe transceiver for generating the temperature information of the device.

29. The device of claim 28, wherein the temperature reporter includes:
 a temperature sensor for sensing a temperature of the device to produce a temperature information; and
 a temperature output circuit to output the temperature information.

30. The device of claim 29, wherein the temperature output circuit includes:
 a signal converter for converting the temperature information into digital temperature data; and
 a format converter for converting the digital temperature data to a serial format.

31. The device of claim 1, wherein the write strobe transceiver is also for transferring a calibrating code, and the device further comprising a calibrator connected to the data transceiver and the write strobe transceiver for adjusting a timing of a transfer of the output data based on the calibrating code.

32. The device of claim 31, wherein the calibrator includes:
 a calibrating code receiver connected to the write transceiver for receiving a calibrating code associated with a timing delay; and
 a storage unit for storing the timing delay.

33. The device of claim 31, wherein the calibrator includes:
 a converter for converting the calibrating code to a parallel format; and
 a decoder for decoding the calibrating code to provide the timing delay.

* * * * *